US012777682B2

(12) United States Patent
Chang et al.

(10) Patent No.: US 12,777,682 B2
(45) Date of Patent: Oct. 27, 2026

(54) SEMICONDUCTOR DEVICE HAVING NANOSHEET TRANSISTOR AND METHODS OF FABRICATION THEREOF

(71) Applicant: TAIWAN SEMICONDUCTOR MANUFACTURING COMPANY, LTD., Hsinchu (TW)

(72) Inventors: Chia-Hao Chang, Hsinchu (TW); Kuan-Ting Pan, Taipei (TW); Jia-Chuan You, Taoyuan (TW); Kuo-Cheng Chiang, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 384 days.

(21) Appl. No.: 18/527,632

(22) Filed: Dec. 4, 2023

(65) Prior Publication Data

US 2025/0040187 A1 Jan. 30, 2025

Related U.S. Application Data

(60) Provisional application No. 63/528,941, filed on Jul. 26, 2023.

(51) Int. Cl.
*H10D 30/67* (2025.01)
*H10D 30/01* (2025.01)
(Continued)

(52) U.S. Cl.
CPC ....... *H10D 30/6735* (2025.01); *H10D 30/014* (2025.01); *H10D 30/43* (2025.01);
(Continued)

(58) Field of Classification Search
CPC .. H10D 30/6735; H10D 30/014; H10D 30/43; H10D 30/6757; H10D 62/121;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

TW 202240897 10/2022

*Primary Examiner* — Karen Kusumakar
(74) *Attorney, Agent, or Firm* — NZ Carr Law Office

(57) ABSTRACT

Various embodiments of the present disclosure provide a semiconductor device structure. In one embodiment, the semiconductor device structure includes a dielectric wall disposed over a substrate, first and second metal gate structure portions respectively disposed at either side of the dielectric wall. Each first and second metal gate structure portion includes a plurality of semiconductor layers vertically stacked and separated from each other, a high-K (HK) dielectric layer disposed to surround at least three surfaces of each of the semiconductor layers, and a gate electrode layer disposed between two neighboring semiconductor layers. The semiconductor device structure also includes a metal layer disposed on two opposing sidewalls of the dielectric wall.

20 Claims, 35 Drawing Sheets

(51) Int. Cl.

| | |
|---|---|
| ***H10D 30/43*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |
| ***H10D 84/83*** | (2025.01) |

(52) U.S. Cl.
CPC ....... *H10D 30/6757* (2025.01); *H10D 62/121* (2025.01); *H10D 64/017* (2025.01); *H10D 84/0135* (2025.01); *H10D 84/0151* (2025.01); *H10D 84/038* (2025.01); *H10D 84/83* (2025.01)

(58) Field of Classification Search
CPC ............. H10D 64/017; H10D 84/0135; H10D 84/0151; H10D 84/038; H10D 84/83; H10D 30/019; H10D 84/833; H10D 30/501; B82Y 10/00
See application file for complete search history.

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2021/0233911 | A1 | 7/2021 | Feng et al. | |
| 2021/0343600 | A1* | 11/2021 | Chen | H10D 64/017 |
| 2022/0320088 | A1* | 10/2022 | Pan | H10D 64/017 |
| 2022/0320089 | A1* | 10/2022 | Chu | H10D 84/0181 |
| 2024/0312996 | A1* | 9/2024 | Lavric | H10D 30/6735 |

* cited by examiner

SEMICONDUCTOR DEVICE HAVING NANOSHEET TRANSISTOR AND METHODS OF FABRICATION THEREOF

CROSS-REFERENCE TO RELATED APPLICATIONS

This application claims priority to U.S. Provisional Application Ser. No. 63/528,941 filed Jul. 26, 2023, which is incorporated by reference in their entirety.

BACKGROUND

As the semiconductor industry introduces new generations of integrated circuits (IC) having higher performance and more functionality, the density of the elements forming the ICs increases, while the dimensions, sizes and spacing between components or elements are reduced. The semiconductor industry continues to improve the integration density of various electronic components (e.g., transistors, diodes, resistors, capacitors, etc.) by continual reductions in minimum feature size, which allow more components to be integrated into a given area.

However, the integrated fabrication also makes the adjustments of component characteristics among different devices further difficult. For example, the parasitic capacitance of different devices is hard to be compromised among devices having different metal dimensions. Therefore, there is a need in the art to provide an improved device that can address the issues mentioned above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
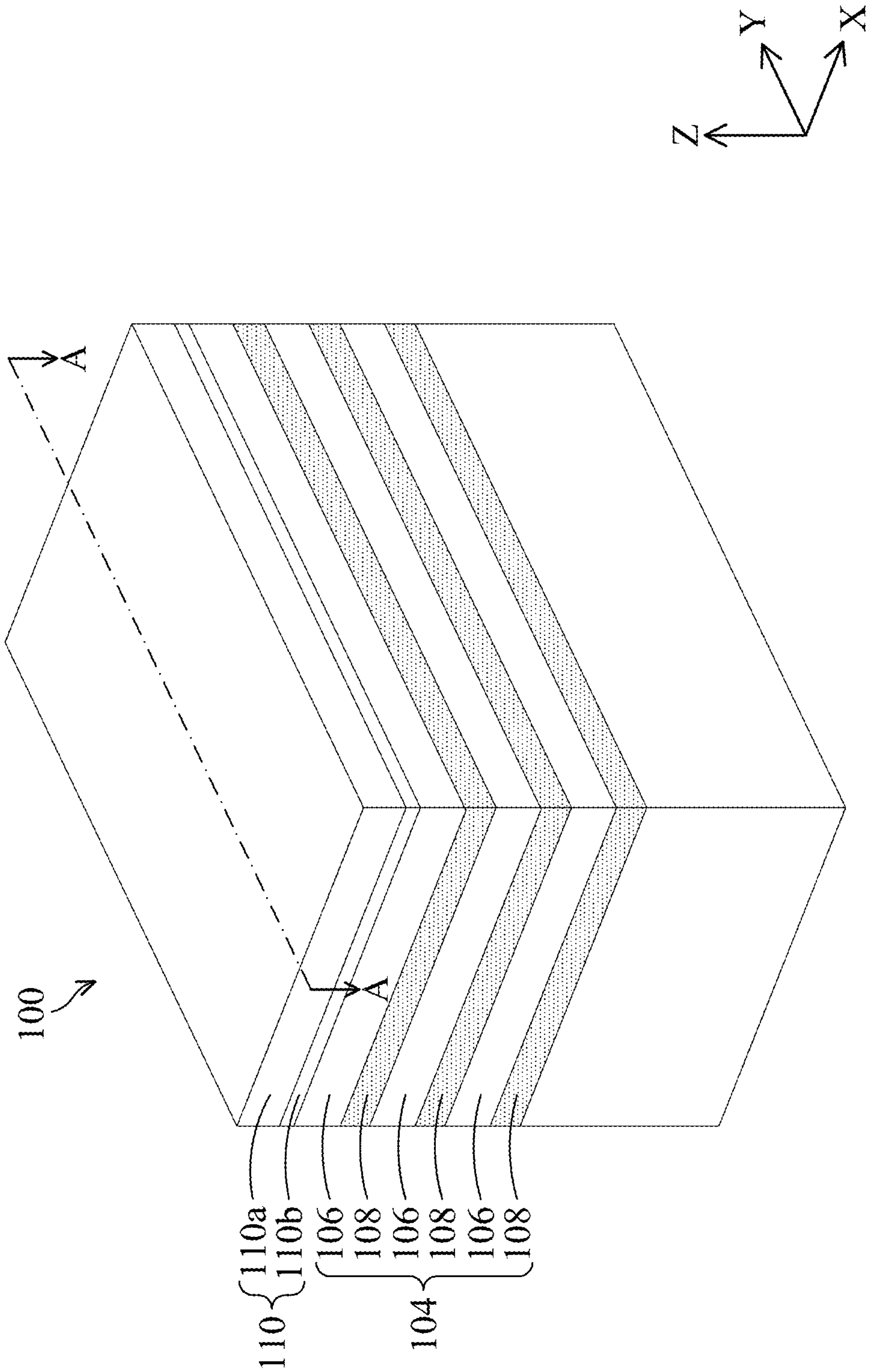
FIGS. 1 to 38 are perspective views of a semiconductor device structure at various fabrication stages constructed according to aspects of one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide semiconductor device structures having a forksheet-like dielectric wall structure and an embedded cut metal gate (CMG) isolation structure to minimize gate-to-source/drain parasitic capacitance. The forksheet-like dielectric wall structure and the dielectric wall structure may be formed as part of a metal gate isolation process. Various embodiments described herein may be employed in the design and/or fabrication of any type of integrated circuit, or portion thereof, which may include any of a plurality of various devices and/or components such as a static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, Omega-gate (52-gate) devices, or Pi-gate (H-gate) devices, as well as strained-semiconductor devices, silicon-on-insulator (SOI) devices, partially-depleted SOI (PD-SOI) devices, fully-depleted SOI (FD-SOI) devices, other memory cells, or other devices known in the art. One of ordinary skills may recognize other embodiments of semiconductor devices and/or circuits, including the design and fabrication thereof, which may benefit from aspects of the present disclosure.

While the embodiments of this disclosure are discussed with respect to nanostructure channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where a gate all around (GAA) transistor structure is adapted, the GAA transistor structure may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1 to 38 are cross-sectional and/or perspective views illustrating a semiconductor device structure 100 at various fabrication stages constructed according to aspects of one or more embodiments of the present disclosure. It is understood that additional operations can be provided before, during, and after processes shown by FIGS. 1 to 38, and some of the operations described below can be replaced or eliminated, for additional embodiments of the method. The order of the operations/processes is not limiting and may be interchangeable.

FIG. 1 is a perspective view of a semiconductor device structure 100 to be processed in accordance with some embodiments of the present disclosure. The semiconductor device structure 100 includes a stack of semiconductor layers 104 formed over a front side of a substrate 101. The substrate 101 may be a semiconductor substrate. The substrate 101 may include a crystalline semiconductor material such as, but not limited to, silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), indium phosphide (InP), or a combination thereof. In one embodiment, the substrate 101 is made of silicon. The substrate 101 may be doped or un-doped. The substrate 101 may be a bulk semiconductor substrate, such as a bulk silicon substrate that is a wafer, a silicon-on-insulator (SOI) substrate, a multi-layered or gradient substrate, or the like.

The substrate 101 may include various regions that have been doped with impurities (e.g., dopants having p-type or n-type conductivity). Depending on circuit design, the dopants may be, for example phosphorus for an n-type field effect transistors (NFET) and boron for a p-type field effect transistors (PFET).

The stack of semiconductor layers 104 includes alternating semiconductor layers made of different materials to facilitate formation of nanosheet channels in a multi-gate device, such as nanosheet channel FETs. In some embodiments, the stack of semiconductor layers 104 includes first semiconductor layers 106 and second semiconductor layers 108 vertically stacked over the substrate 101. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GalnP, GalnAsP, or any combinations thereof.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100.

A mask structure 110 is formed over the stack of semiconductor layers 104. The mask structure 110 may include an oxygen-containing layer 110*a* and a nitrogen-containing layer 110*b*. The oxygen-containing layer 110*a* may be a pad oxide layer, such as a $SiO_2$ layer. The nitrogen-containing layer 110*b* may be a pad nitride layer, such as $Si_3N_4$. The mask structure 110 may be formed by any suitable deposition process, such as chemical vapor deposition (CVD) process.

Figure 2:
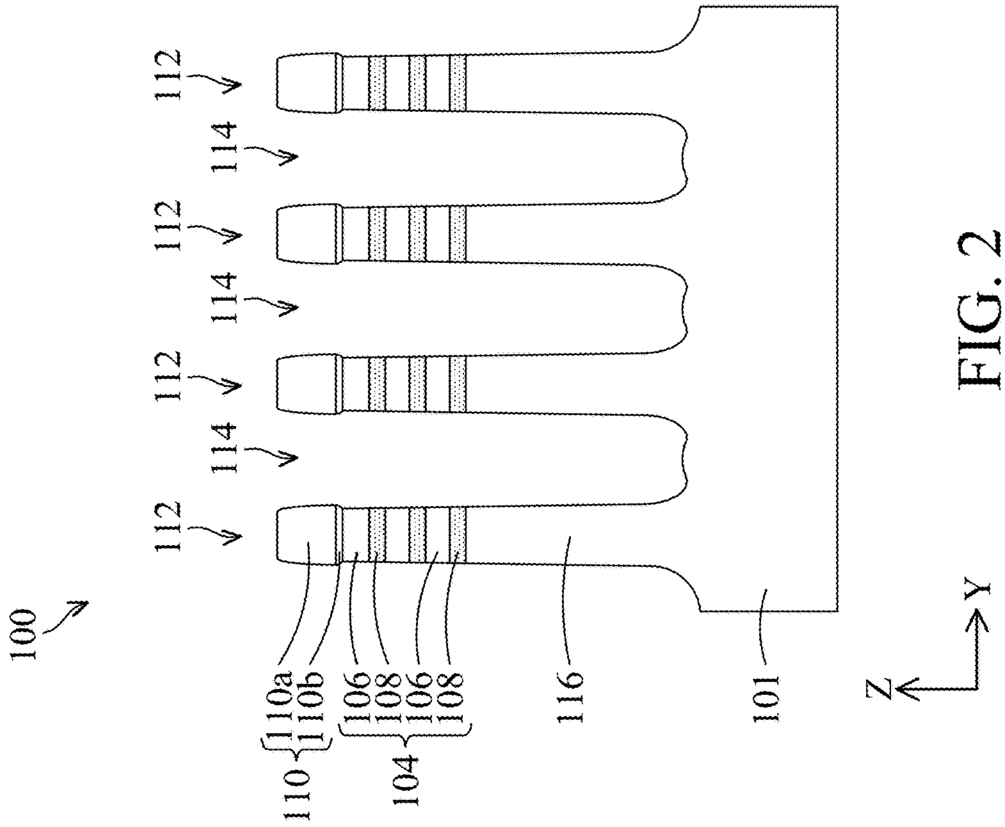

FIGS. 2-5 illustrate cross-sectional views of various stages of manufacturing the semiconductor device structure 100 taken along cross-section A-A of FIG. 1, in accordance with some embodiments. As shown in FIG. 2, fin structures 112 are formed from the stack of semiconductor layers 104. Each fin structure 112 has an upper portion including the semiconductor layers 106, 108 and a well portion 116 formed from the substrate 101. The fin structures 112 may be formed by patterning a hard mask layer (not shown) formed on the stack of semiconductor layers 104 using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process.

The etching process forms trenches 114 in unprotected regions through the mask structure 110, the stack of semiconductor layers 104, and into the substrate 101, thereby leaving the plurality of extending fin structures 112. The trenches 114 extend along the X direction. The trenches 114 may be etched using a dry etch (e.g., RIE), a wet etch, and/or combination thereof. The trenches 114 may be formed with different widths. For example, a trench between a first set of two immediately adjacent fin structures 112 may have a first width, and a trench between a second set of two immediately adjacent fin structures 112 may have a second width. The first width may be equal, less, or greater than the second width, depending on the channel width of the devices needed in the semiconductor device structure 100.

Figure 3:
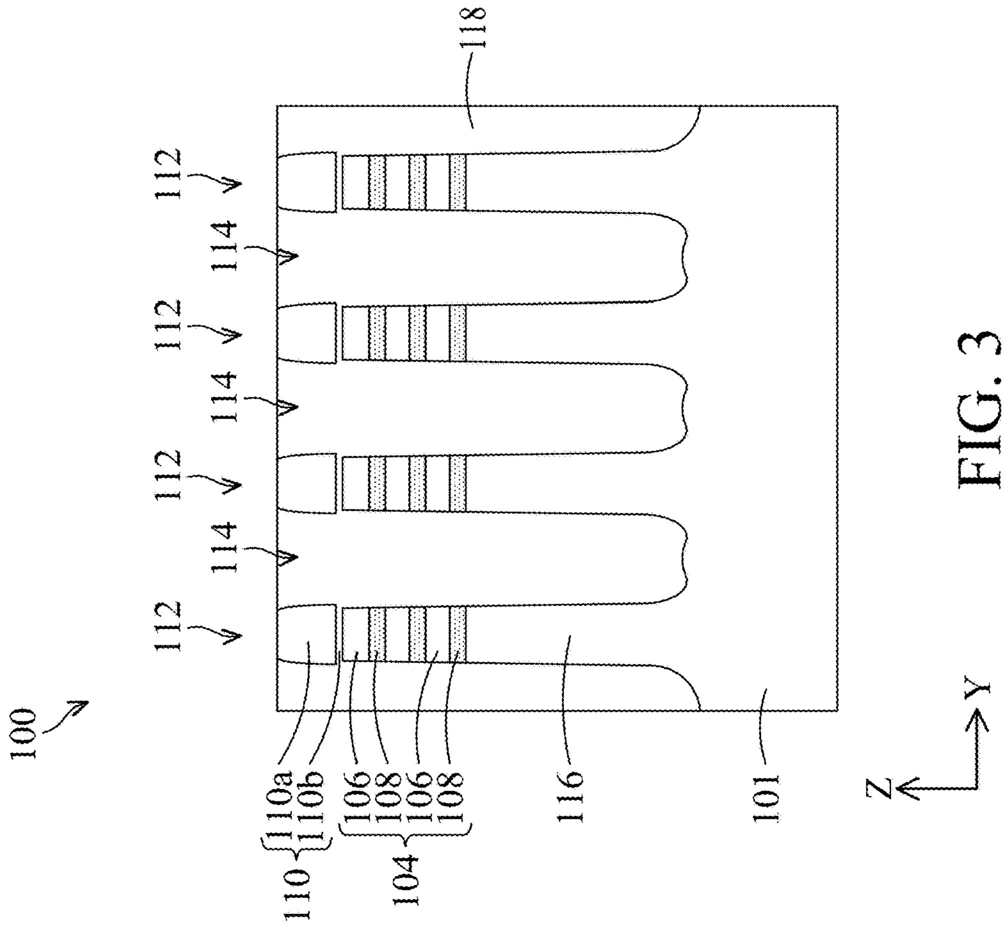

In FIG. 3, after the fin structures 112 are formed, an insulating material 118 is formed on the substrate 101. The insulating material 118 fills the trenches 114 between neighboring fin structures 112 until the fin structures 112 are embedded in the insulating material 118. Then, a planarization process, such as a chemical mechanical polishing (CMP) method and/or an etch-back method, is performed such that the top of the mask structure 110 is exposed. The insulating material 118 may be made of silicon oxide, silicon nitride, silicon oxynitride (SION), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
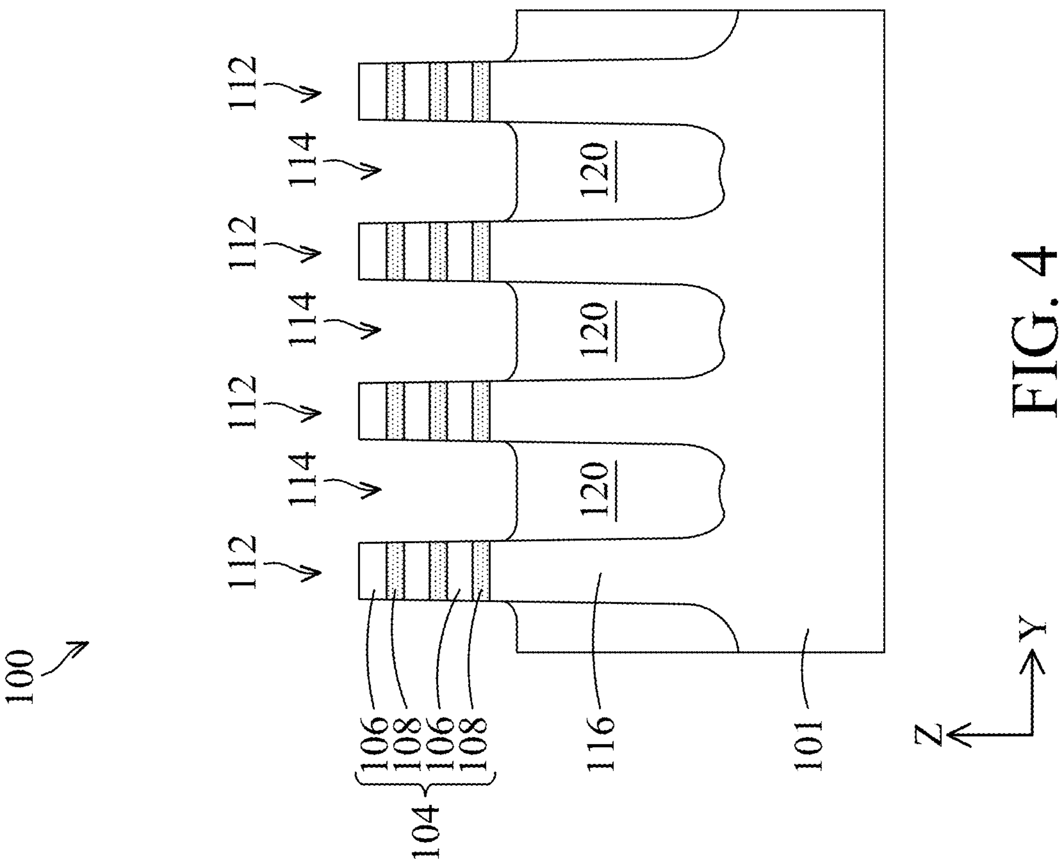

In FIG. 4, the insulating material 118 is recessed to form an isolation region 120 interposing the fin structures 112. The recess of the insulating material 118 exposes portions of the fin structures 112, such as the stack of semiconductor layers 104. The recess of the insulating material 118 reveals the trenches 114 between the neighboring fin structures 112. The isolation region 120 may be formed using a suitable process, such as a dry etching process, a wet etching process, or a combination thereof. A top surface of the insulating material 118 may be substantially level with or at a below a surface of the second semiconductor layers 108 in contact with the well portion 116 formed from the substrate 101. The mask structure 110 may be removed using one or more etch processes.

Figure 5:
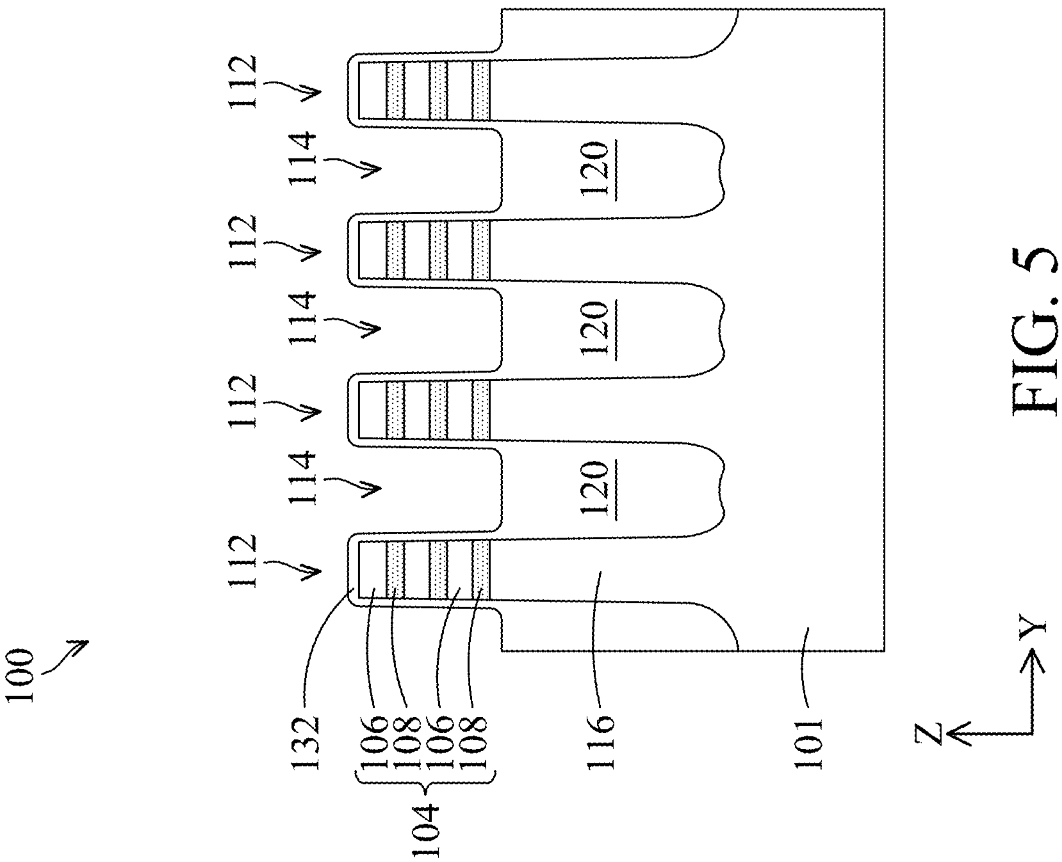

In FIG. 5, a cap layer 132 is formed on the exposed surfaces of the fin structures 112 and the isolation region 120. The cap layer 132 may include one or more layers of dielectric material, such as SiN, SiON, silicon carbonitride (SiCN), silicon oxycarbonitride (SiOCN), or other appropriate oxide material. The cap layer 132 may be a conformal layer and may be formed by a conformal process, such as an atomic layer deposition (ALD) process. The term "conformal" may be used herein for ease of description upon a layer having substantial same thickness over various regions.

Figure 6:
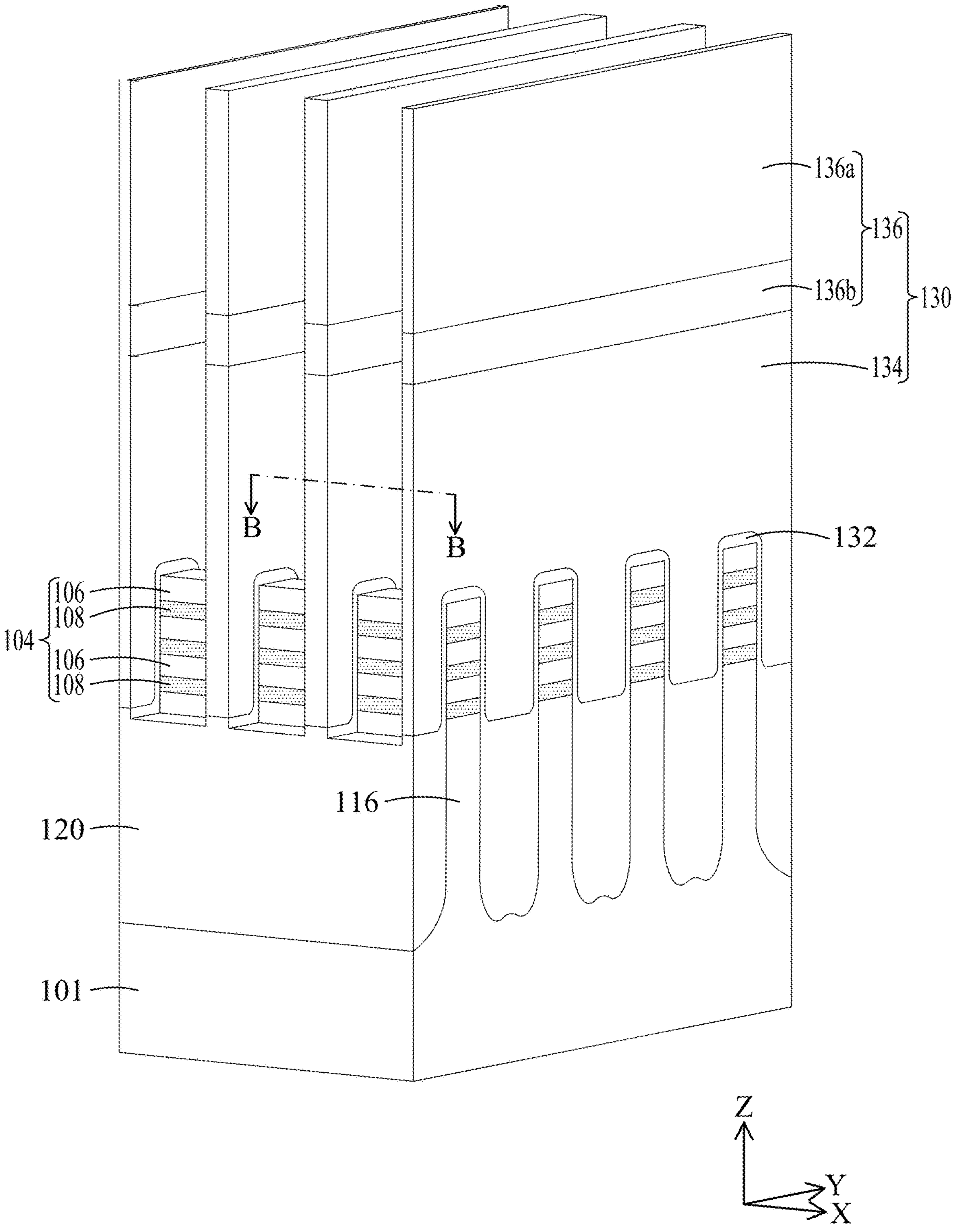

FIG. 6 illustrates a perspective view of the semiconductor device structure 100 having one or more sacrificial gate structures 130 formed thereon. In FIG. 6, after the cap layer 132 is formed, one or more sacrificial gate structures 130 are deposited over the stack of semiconductor layers 104 and the substrate 101. Each sacrificial gate structure 130 is formed over a portion of the fin structures 112, and may include a sacrificial gate electrode layer 134 and a mask layer 136. The sacrificial gate electrode layer 134 may include silicon such as polycrystalline silicon or amorphous silicon. The mask layer 136 may include an oxide layer 136*a* and a nitride layer 136*b*. The sacrificial gate electrode layer 134 and the mask layer 136 may be formed by sequentially depositing blanket layers of the sacrificial gate electrode layer 134 and the mask layer 136 on the cap layer 132 and the isolation region 120. The mask layer 136 is patterned and used to pattern the sacrificial gate electrode layer 134, resulting in sacrificial gate structures 130 extending along a direction (i.e., the Y-direction) that is perpendicular to the fin structures 112. While four sacrificial gate structures 130 are shown, more or less sacrificial gate structures 130 may be arranged along the X-direction in some embodiments.

In some embodiments, portions of the cap layer 132 that are exposed through the sacrificial gate structures 130 may be removed, thereby exposing the topmost layer of the stack of semiconductor layers 104, such as the first semiconductor layer 106 as shown in FIG. 6.

Figure 7:
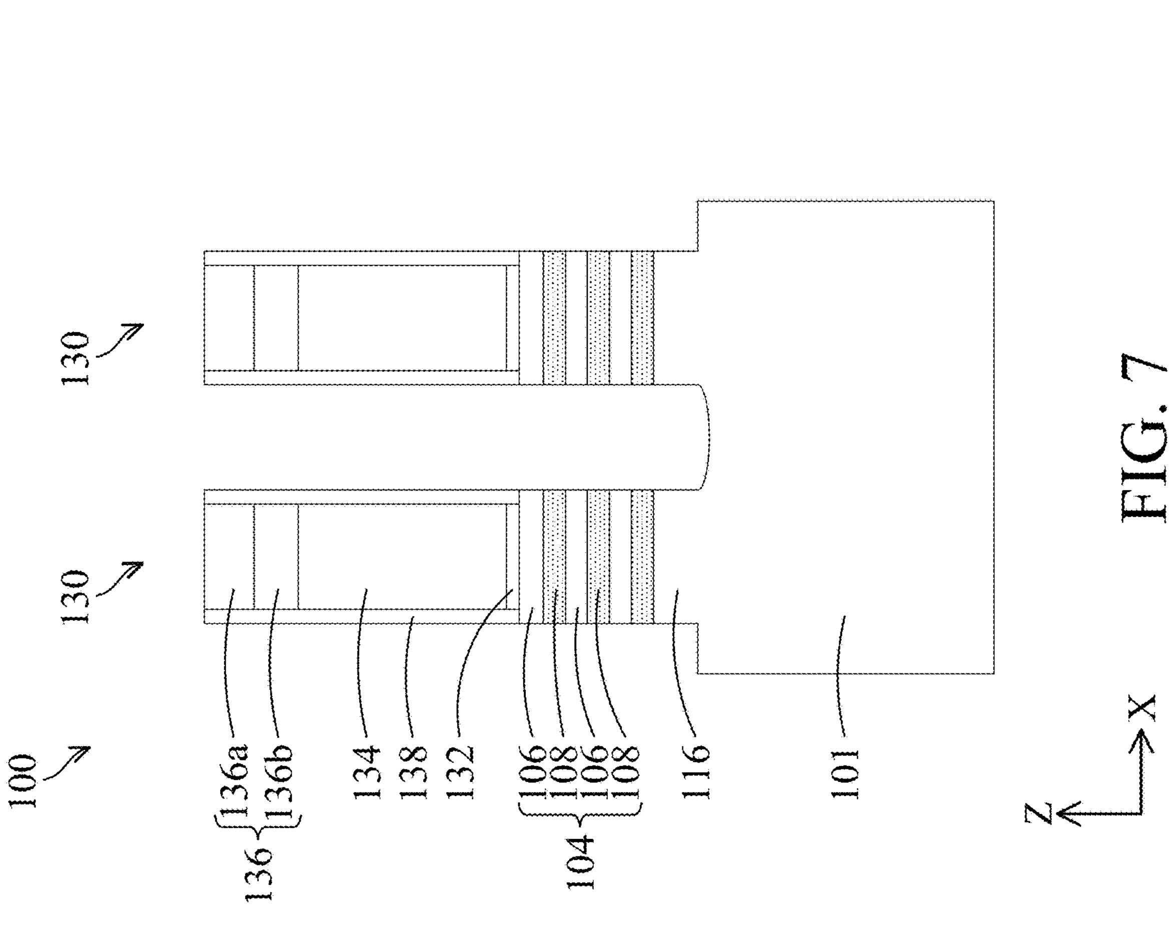

FIGS. 7-10 are cross-sectional views of one of intermediate semiconductor device structure 100 taken along cross-section B-B of FIG. 6. In FIG. 7, gate spacers 138 are formed over sidewalls of the sacrificial gate structures 130. The gate spacers 138 may be formed by first depositing a conformal layer that is subsequently etched back to form gate spacers 138. For example, a spacer material layer may be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fin structures 112, leaving the gate spacers 138 on the vertical surfaces, such as the sidewalls of sacrificial gate structures 130. The gate spacer 138 may be made of a dielectric material such as silicon oxide, silicon nitride, silicon carbide, silicon oxynitride, SiCN, silicon oxycarbide, SiOCN, and/or combinations thereof.

Next, exposed portions of the fin structures 112 not covered by the sacrificial gate structures 130 and the gate spacers 138 are recessed down below the top surface of the isolation region 120 (FIG. 6), by using one or more suitable etch processes, such as dry etch, wet etch, or a combination thereof. In some embodiments, exposed portions of the stacks of semiconductor layers 104 of the fin structures 112 are removed, exposing portions of the well portions 116 of the substrate 101. In one embodiment, the exposed portions of the fin structures 112 are recessed to a level below the bottommost layer of the stack of the semiconductor layers 104, such as the second semiconductor layer 108. At this stage, end portions of the stacks of semiconductor layers 104 under the sacrificial gate structures 130 and the gate spacers 138 have substantially flat surfaces which may be flush with corresponding gate spacers 138, as shown in FIG. 7. In some embodiments, the end portions of the stacks of semiconductor layers 104 under the sacrificial gate structures 130 and the gate spacers 138 are slightly horizontally etched.

The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100. In some cases, some S/D regions may be shared between various transistors.

Figure 8:
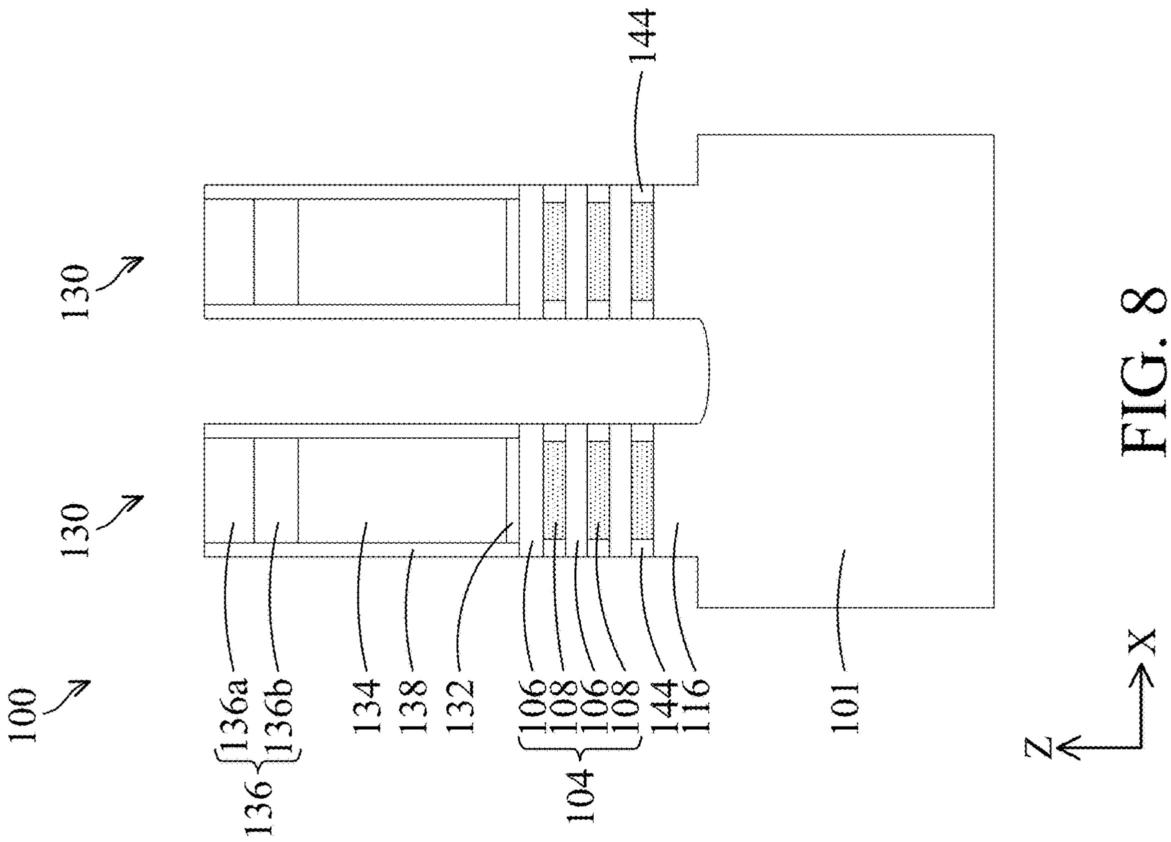

In FIG. 8, edge portions of each second semiconductor layer 108 of the stack of semiconductor layers 104 are removed horizontally along the X direction. The removal of the edge portions of the second semiconductor layers 108 forms cavities between the first semiconductor layers 106. Next, an insulating layer is filled in the cavities to form dielectric spacers 144. The insulating layer may include a low-K dielectric material, such as SiON, SiCN, SiOC, SiOCN, or SiN. In some embodiments, the dielectric spacers 144 may be formed by first forming a conformal dielectric layer using a conformal deposition process, such as ALD, followed by an anisotropic etching to remove portions of the conformal dielectric layer other than the dielectric spacers 144.

Figure 9:
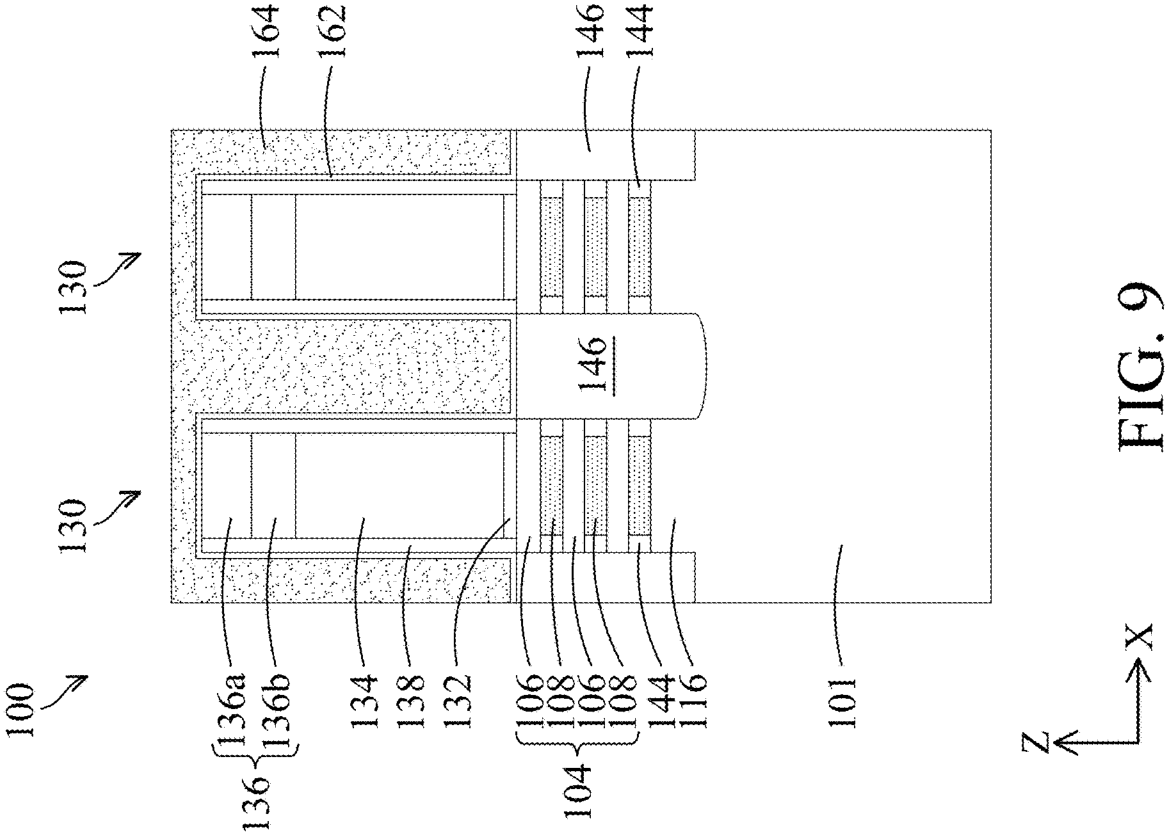

In FIG. 9, epitaxial source/drain (S/D) features 146 are formed at opposing sides of the sacrificial gate structures 130. The epitaxial S/D feature 146 may include one or more layers of Si, SiP, SiC and SiCP for an n-channel FET or Si, SiGe, Ge for a p-channel FET. The epitaxial S/D features 146 may grow both vertically and horizontally to form facets, which may correspond to crystalline planes of the material used for the substrate 101. The epitaxial S/D features 146 are formed by an epitaxial growth method using CVD, ALD or MBE. The epitaxial S/D features 146 are in contact with the first semiconductor layers 106 and dielectric spacers 144. The epitaxial S/D features 146 may be the S/D regions. For example, one of a pair of epitaxial S/D features 146 located on one side of the stack of semiconductor layers 104 can be a source region, and the other of the pair of epitaxial S/D features 146 located on the other side of the stack of semiconductor layers 104 can be a drain region. A pair of epitaxial S/D features 146 includes a source epitaxial feature 146 and a drain epitaxial feature 146 connected by the channels (i.e., the first semiconductor layers 106). In this disclosure, a source and a drain are interchangeably used, and the structures thereof are substantially the same.

After the formation of the epitaxial S/D features 146, a contact etch stop layer (CESL) 162 is formed on the epitaxial S/D features 146 and the sacrificial gate structures 130. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof. The CESL 162 may be formed by CVD, PECVD, ALD, or any suitable deposition technique. In some embodiments, the CESL 162 is a conformal layer formed by the ALD process. Next, an interlayer dielectric (ILD) layer 164 is formed on the CESL 162. The materials for the ILD layer 164 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 164 may be deposited by a PECVD process or other suitable deposition technique.

Figure 10:
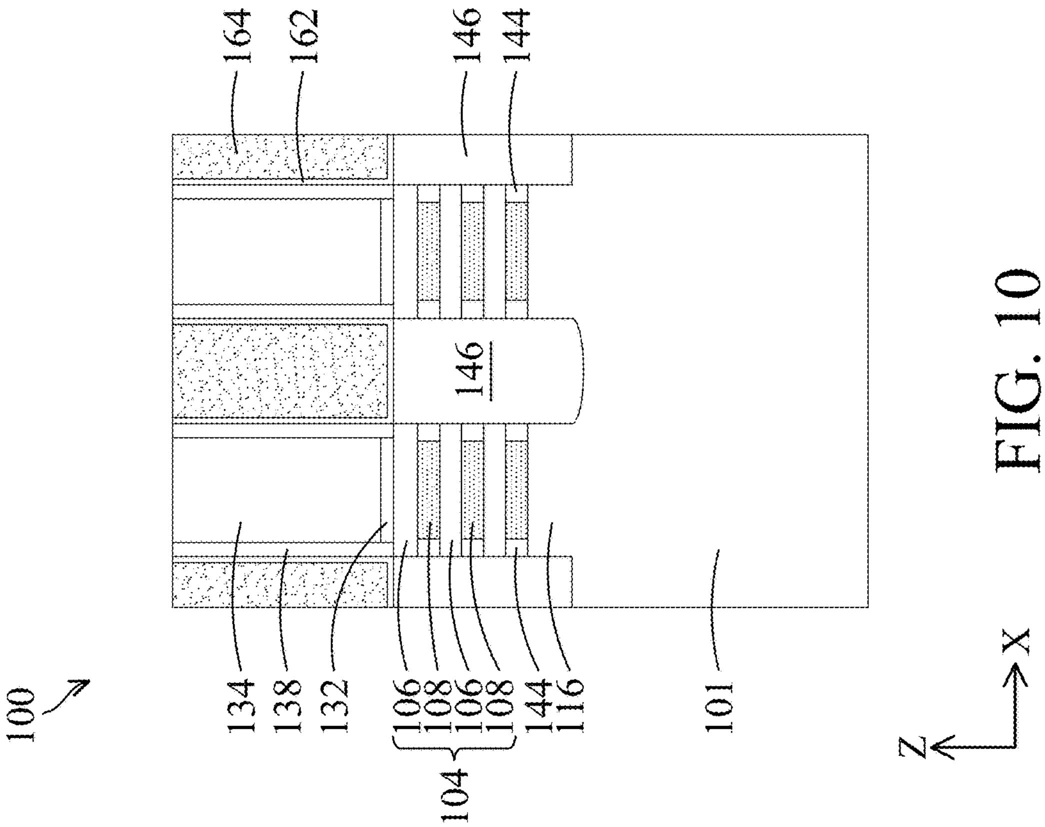
Figure 11:
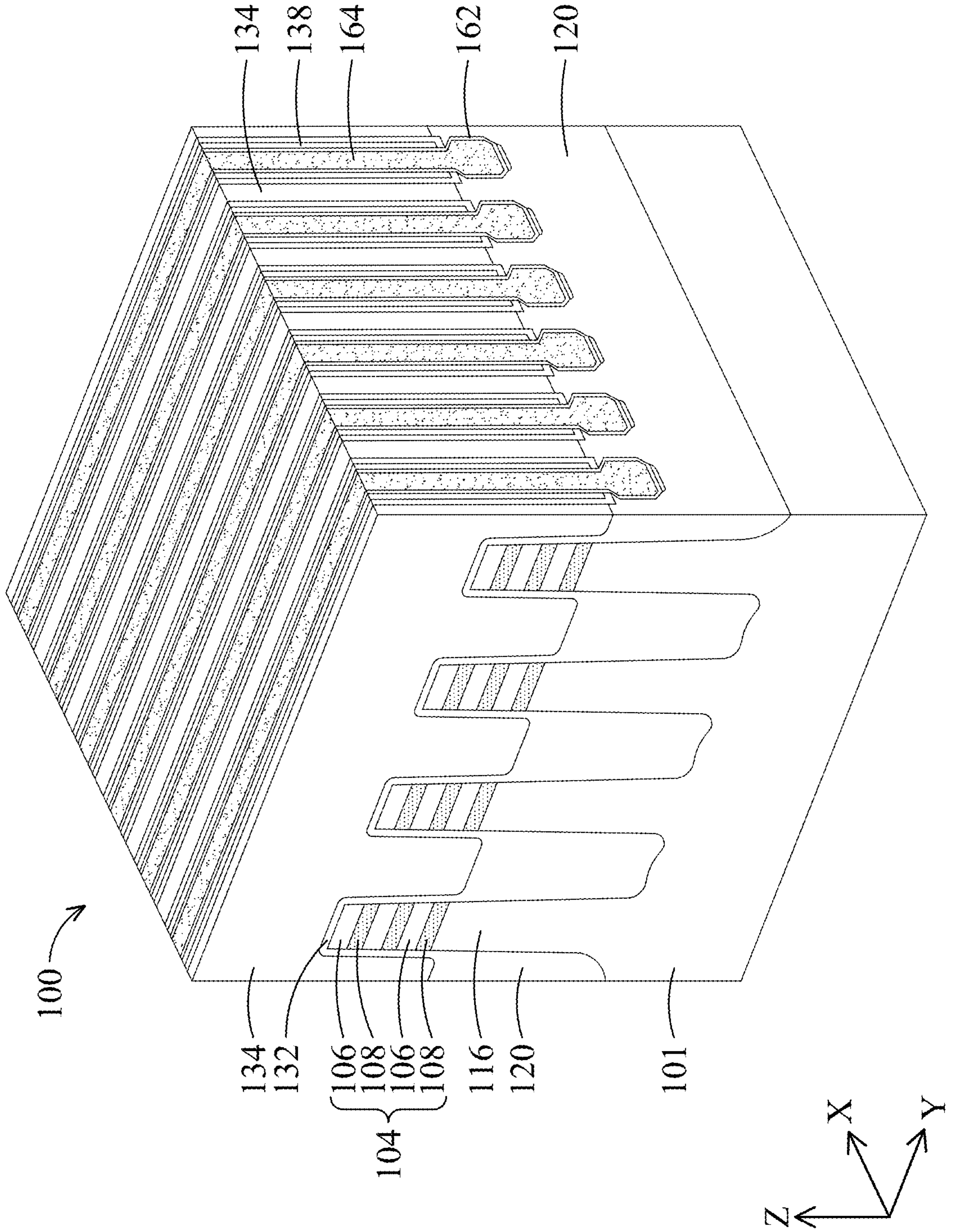

In FIG. 10, a planarization process is performed on the semiconductor device structure 100 to remove portions of the ILD layer 164 and the CESL 162 disposed on the sacrificial gate structures 130. The planarization process may be any suitable process, such as a CMP process. The planarization process may be performed until the sacrificial gate electrode layer 134 is exposed. After the planarization process, the top surfaces of the CESL 162, the ILD layer 164, the gate spacers 138, and the sacrificial gate electrode layer 134 are substantially co-planar. FIG. 11 illustrates a perspective view of the intermediate semiconductor device structure 100 after the planarization process.

Figure 12:
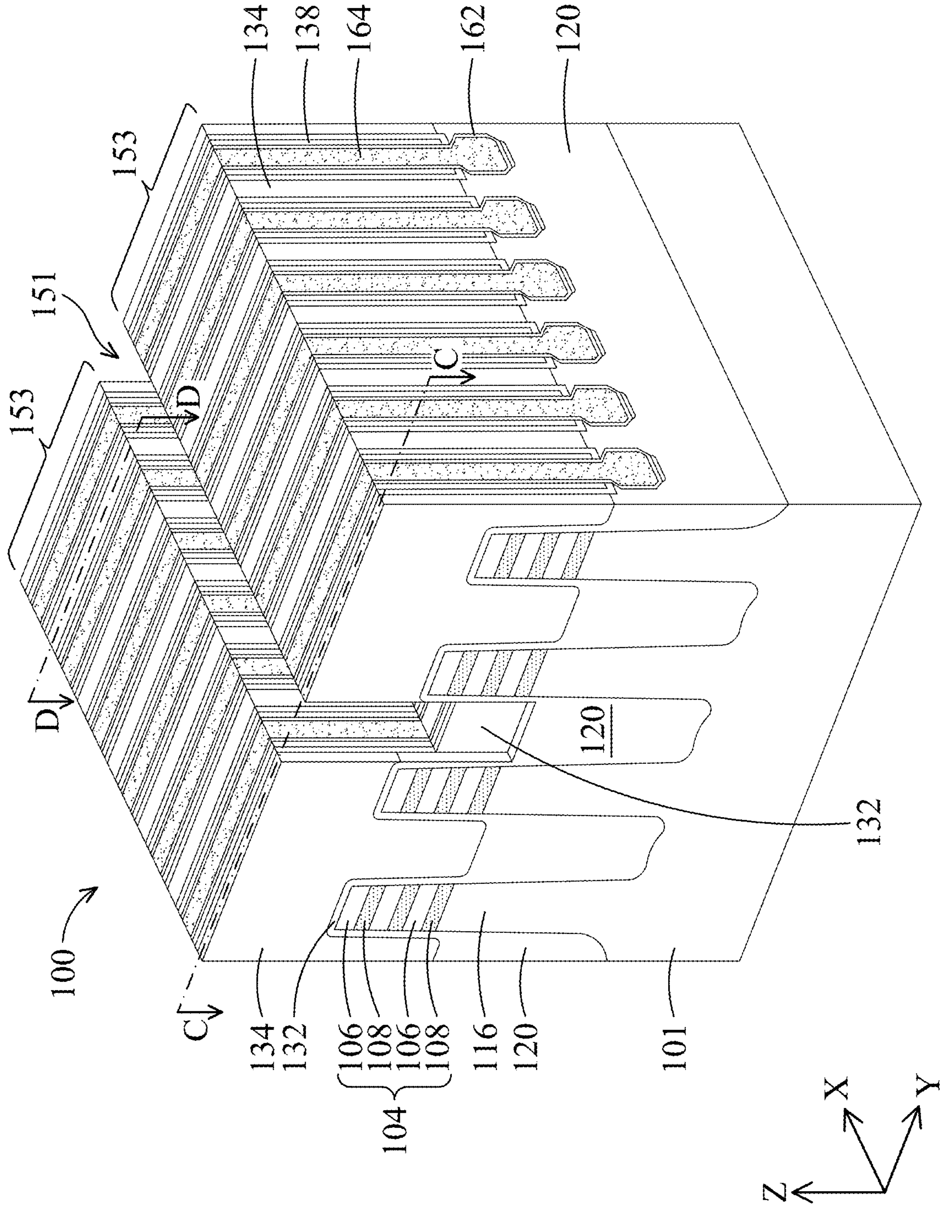
Figure 13:
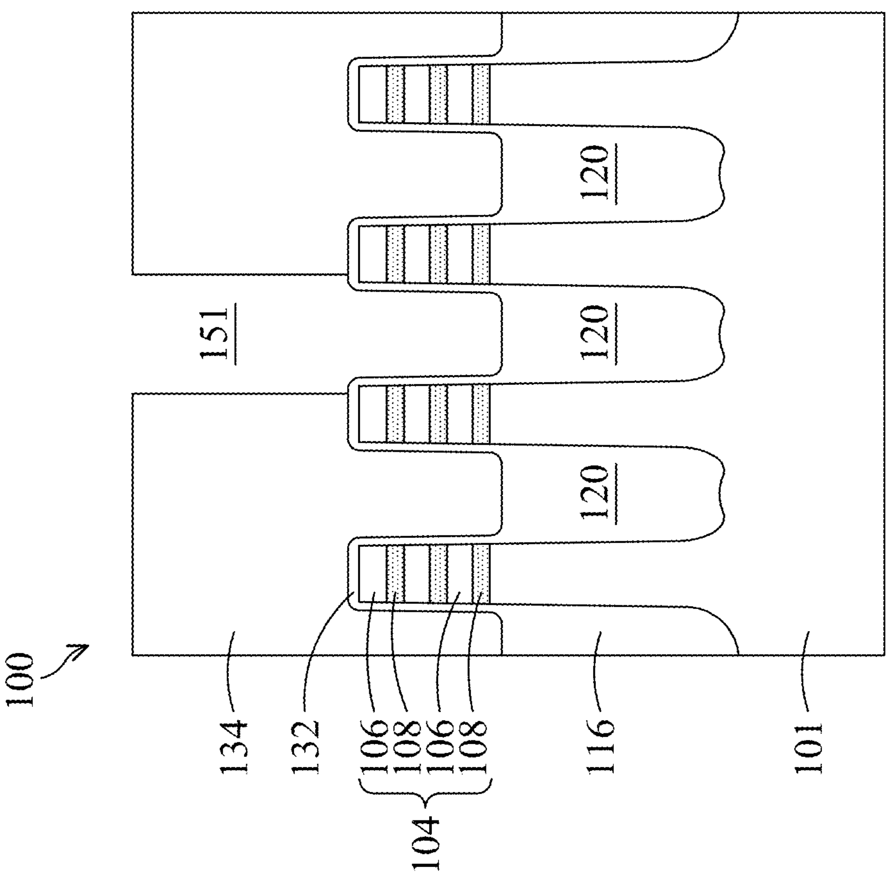

In FIG. 12, one or more isolation trenches 151 (only one is shown) are formed in the semiconductor device structure 100. The one or more isolation trenches 151 may be formed by providing a patterned mask structure (not shown) over the substrate 101. One or more photolithographic processes may be performed to form openings in the CESL 162, the ILD layer 164, the gate spacers 138, and the sacrificial gate electrode layer 134 the semiconductor device structure 100. The opening defines an isolation trench 151 to be formed in the semiconductor device structure 100, and may be disposed between neighboring active regions 153. The term "active region" in this disclosure refers to a region where transistors are located. Therefore, the sacrificial gate structures 130 in the active regions 153 are protected by the patterned mask structure. The isolation trenches 151 may extend laterally along a direction parallel to the longitudinal direction of the fin structures 112. In some embodiments, the cap layer 132 is exposed through a bottom and a lower portion of a sidewall of the isolation trench 151. In some embodiments, a portion of the sacrificial gate electrode layer 134 is exposed through an upper portion of the sidewall of the isolation trench 151. In some embodiments, the isolation trenches 151 may extend all the way to expose a top surface of the isolation region 120. In some embodiments, the isolation trenches 151 is formed to expose at least sidewalls of the cap layer 132 formed over the fin structures 112. FIG. 13 illustrates a cross-sectional view of the semiconductor device structure 100 taken along cross-section C-C of FIG. 12.

Figure 14:
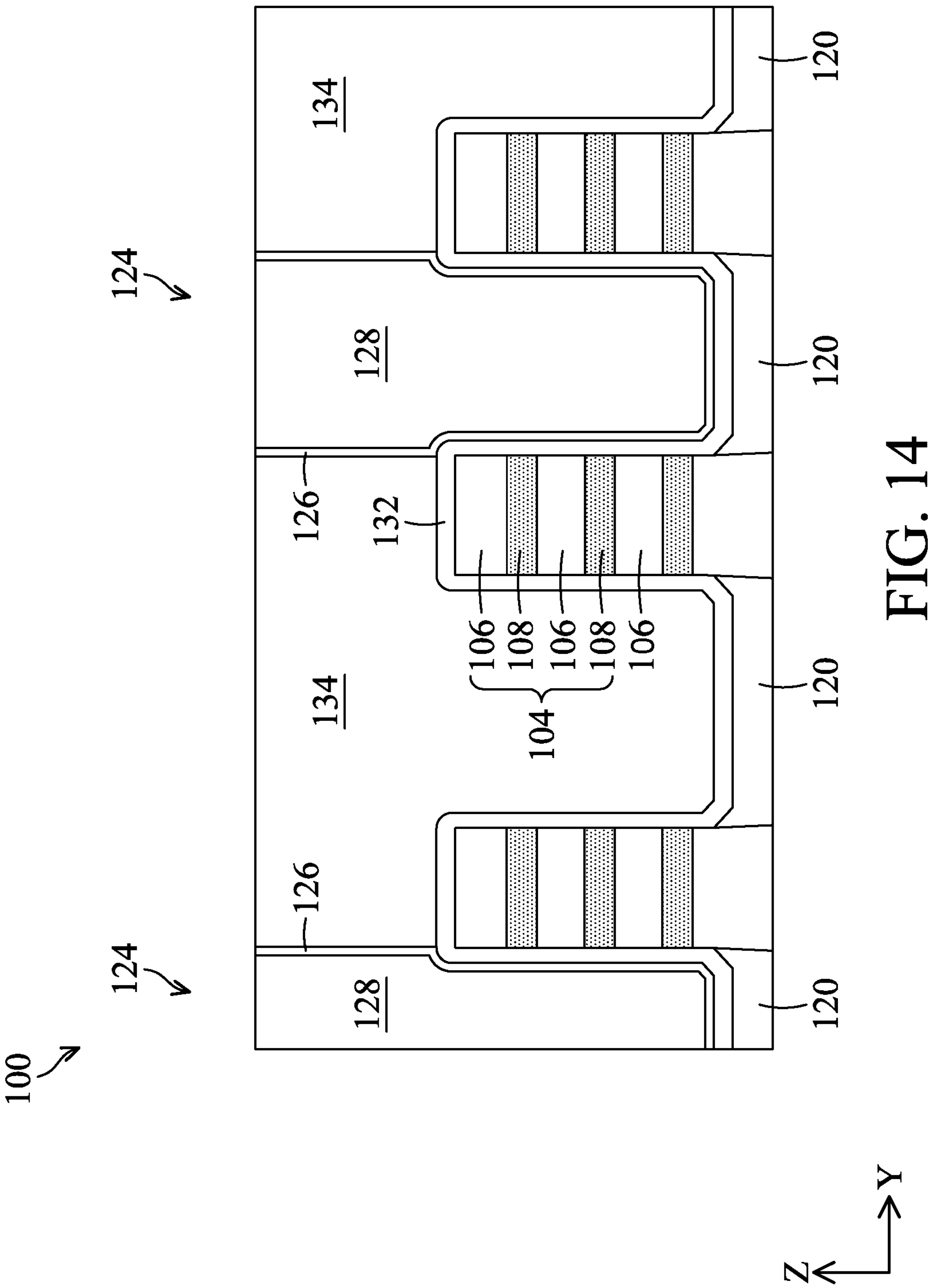

FIGS. 14-15 and 17-27 are cross-sectional views of various stages of manufacturing the semiconductor device structure 100 taken along cross-section D-D of FIG. 12. In FIG. 14, a first dielectric wall 124 is formed to fill the isolation trenches 151. In some embodiments, the first dielectric wall 124 may be a single-layer structure. In some embodiments, the first dielectric wall 124 may be multi-layer structure. In one embodiment shown in FIG. 14, the first dielectric wall 124 is a bi-layer structure that includes a liner 126 and a dielectric layer 128 formed on the liner 126. An upper portion of the liner 126 may be disposed between the dielectric layer 128 and the sacrificial gate electrode layer 134, and a lower portion of the liner 126 may be disposed between the dielectric layer 128 and the cap layer 132. A thickness of the liner 126 is less than a thickness of the dielectric layer 128. The liner 126 and the dielectric layer 128 include different dielectric materials.

The liner 126 and the dielectric layer 128 may be an oxide, a nitride, or any suitable low-K or high-K dielectric material, or any combination thereof. The liner 126 and the dielectric layer 128 may include a material that is chemically different from each other. Suitable low-K dielectric materials may include, but are not limited to $SiO_2$, SiN, SiCN, SiOC, SiOCN, or the like. Suitable high-K dielectric materials may include, but are not limited to $HfO_2$, $ZrO_2$, $HfAlO_x$, $HfSiO_x$, $Al_2O_3$, or the like. The liner 126 may be conformally formed prior to the forming of the dielectric layer 128. The dielectric material of the dielectric layer 128 may overfill the isolation trenches 151 and to a height over the top surface of the sacrificial gate electrode layer 134. Thereafter, a planarization process, such as a CMP process, may be performed on the semiconductor device structure 100 until the ILD layer 164 is exposed. After the planarization process, the top surfaces of the dielectric layer 128, the liner 126, the sacrificial gate electrode layer 134, the gate spacers 138, the ILD layer 164, and the CESL 162 are substantially co-planar, as shown in FIG. 14.

Figure 15:
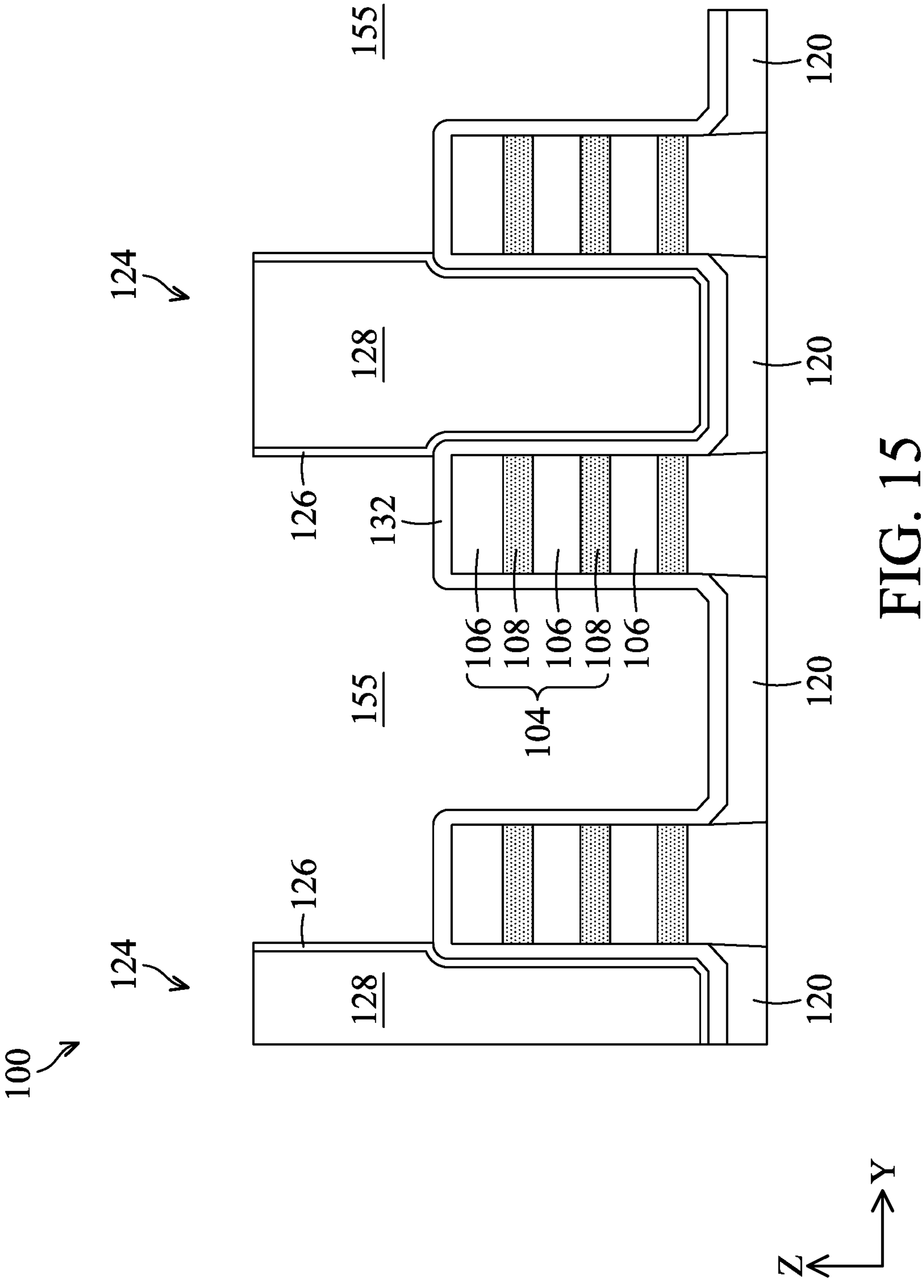
Figure 16:
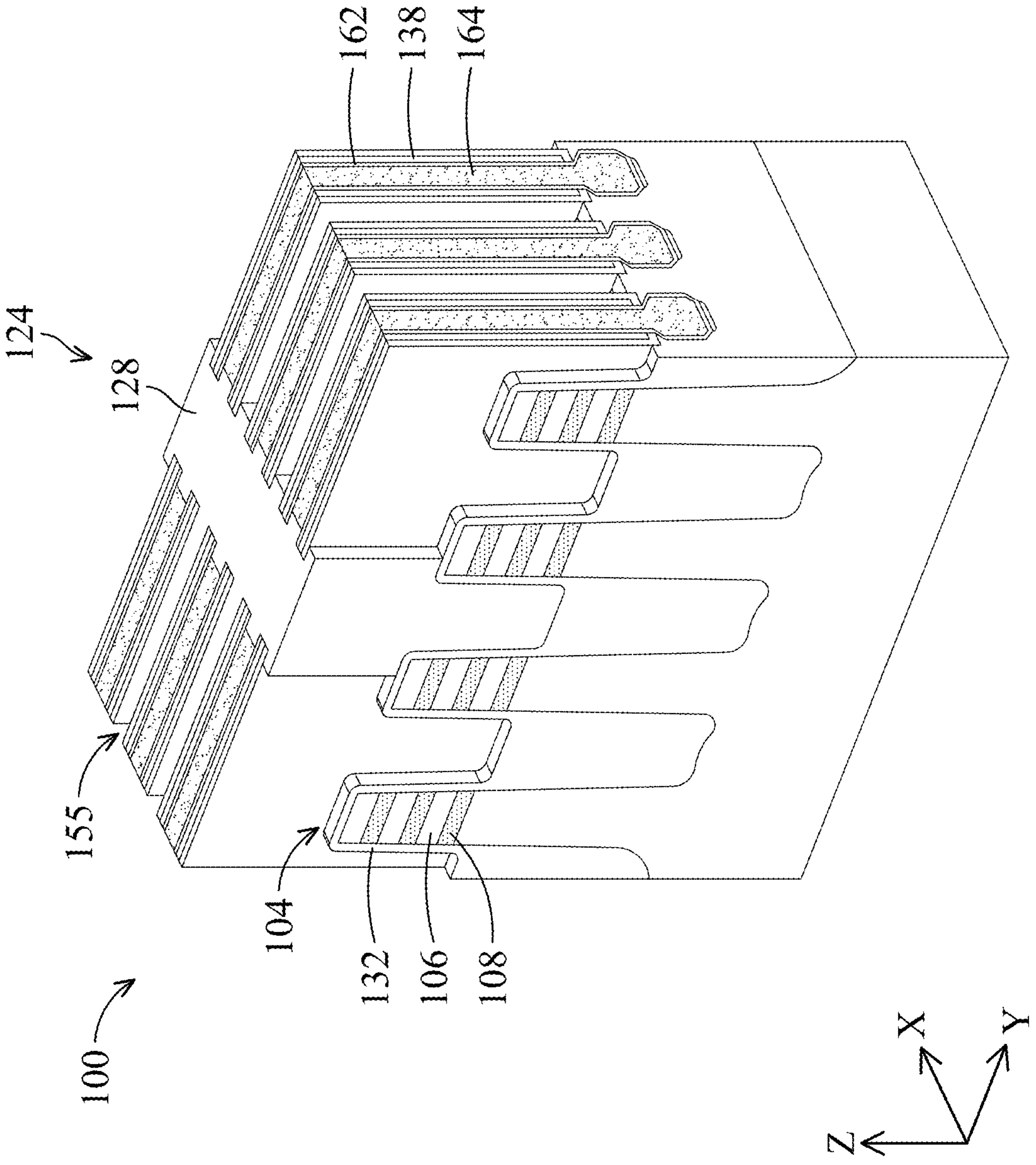

In FIG. 15, a remaining portion of the sacrificial gate electrode layers 134 is removed to form a plurality of trenches 155. The removal of the sacrificial gate electrode layers 134 may be achieved by any suitable removal process, such as dry etch, wet, etch, or a combination thereof. The removal process may be a selective etch processes that removes the sacrificial gate electrode layer 134 but not the dielectric layer 128, the liner 126, the cap layer 132, the gate spacers 138, the ILD layer 164, and the CESL 162. As a result of the removal process, the cap layer 132 covering the stack of semiconductor layers 104 and the first dielectric wall 124 are exposed through sidewalls of each trench 155. FIG. 16 illustrates a perspective view of the semiconductor device structure 100 after forming the trenches 155.

Figure 17:
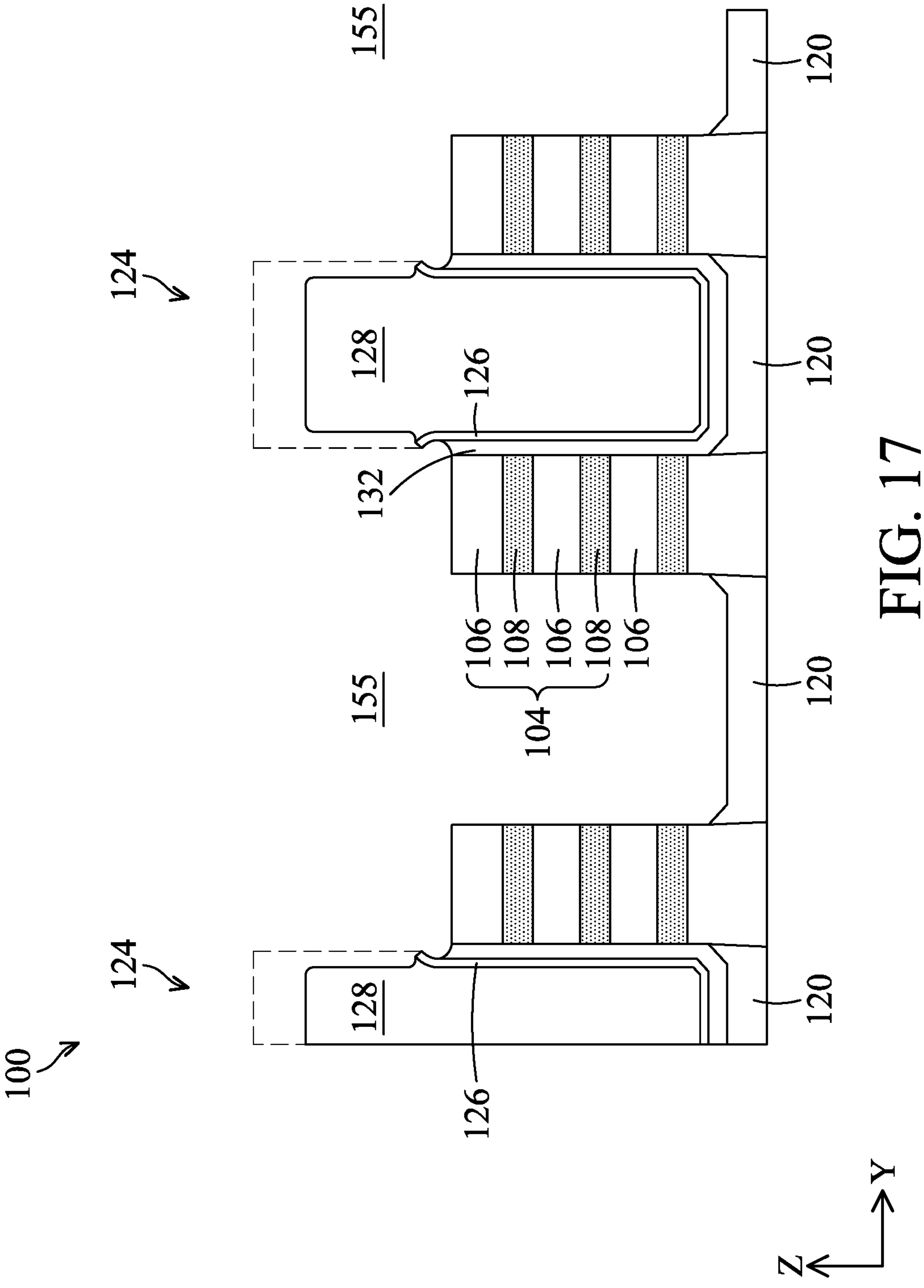

In FIG. 17, the dielectric layer 128 is trimmed and the exposed portions of the cap layer 132 and the liner 126 are removed. The trimmed dielectric layer 128 is represented by dashed lines. The dielectric layer 128 may be trimmed by first removing a portion of the liner 126, which is exposed through the trenches 155, to reveal the dielectric layer 128 through the sidewalls of the trenches 155. In such cases, the remaining portion of the liner 126 that is sandwiched between the dielectric layer 128 and the cap layer 132 may be impervious, and therefore remains. Thereafter, a portion of the exposed cap layer 132 is removed such that the stack of semiconductor layers 104 is exposed through the trenches 155.

The removal of the cap layer 132, the dielectric layer 128, and the liner 126 may be achieved by any suitable removal process, such as dry etch, wet, etch, or a combination thereof. The removal process is a selective etch process that removes the dielectric materials but not the semiconductor materials (e.g., first and second semiconductor layers 106, 108). In some embodiments, the etch time of the removal process may be controlled to adjust the amount of the dielectric layer 128 trimmed. In some embodiments, a portion of the liner 126 at the corner of the cap layer 132 and the dielectric layer 128 may remain after the removal process. The trimming of the dielectric layer 128 allows increased surface area of the channel region (e.g., first semiconductor layers 106) to the subsequent gate electrode layer. As a result, the overall performance of the semiconductor device structure 100 is improved.

Figure 18:
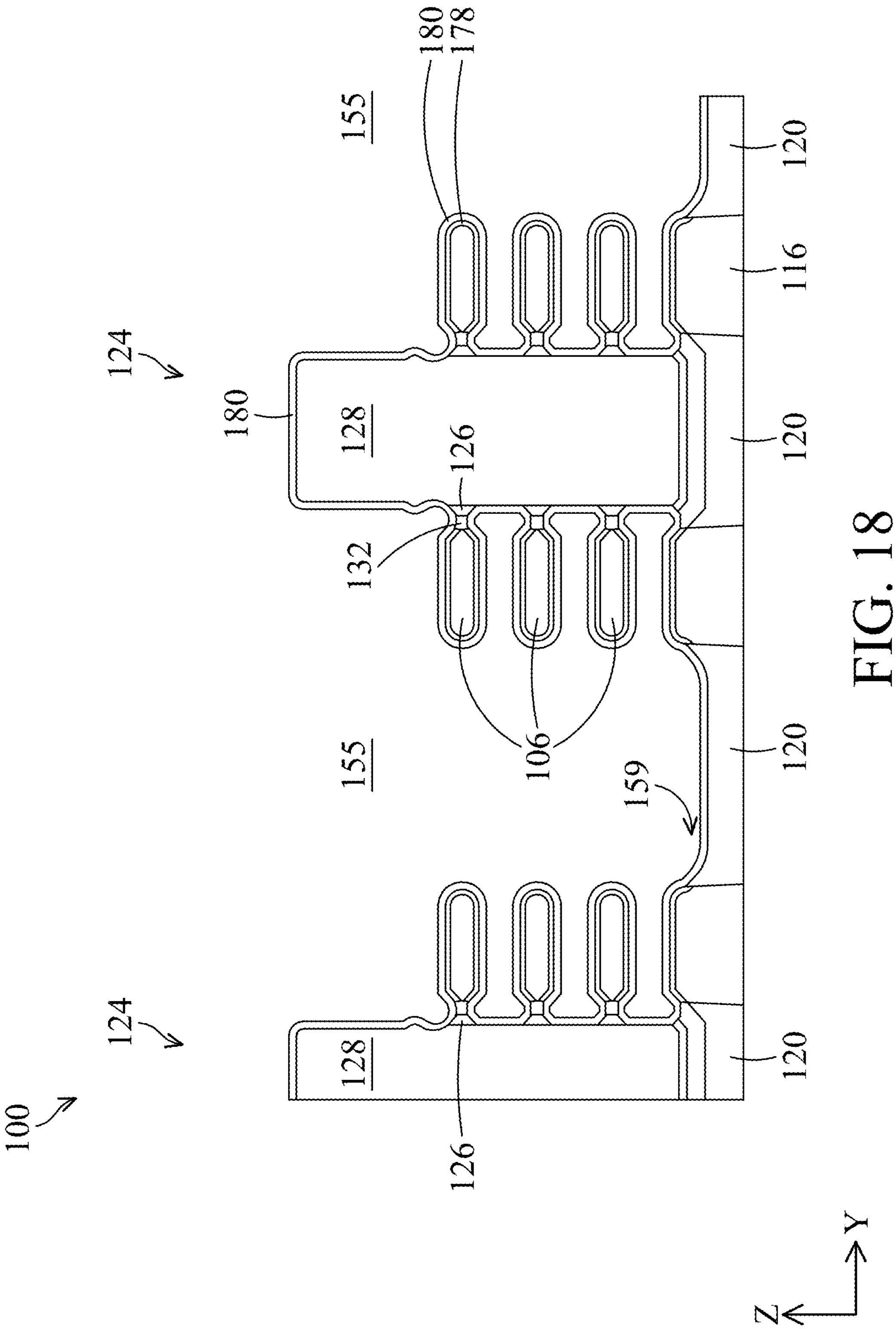
Figure 19:
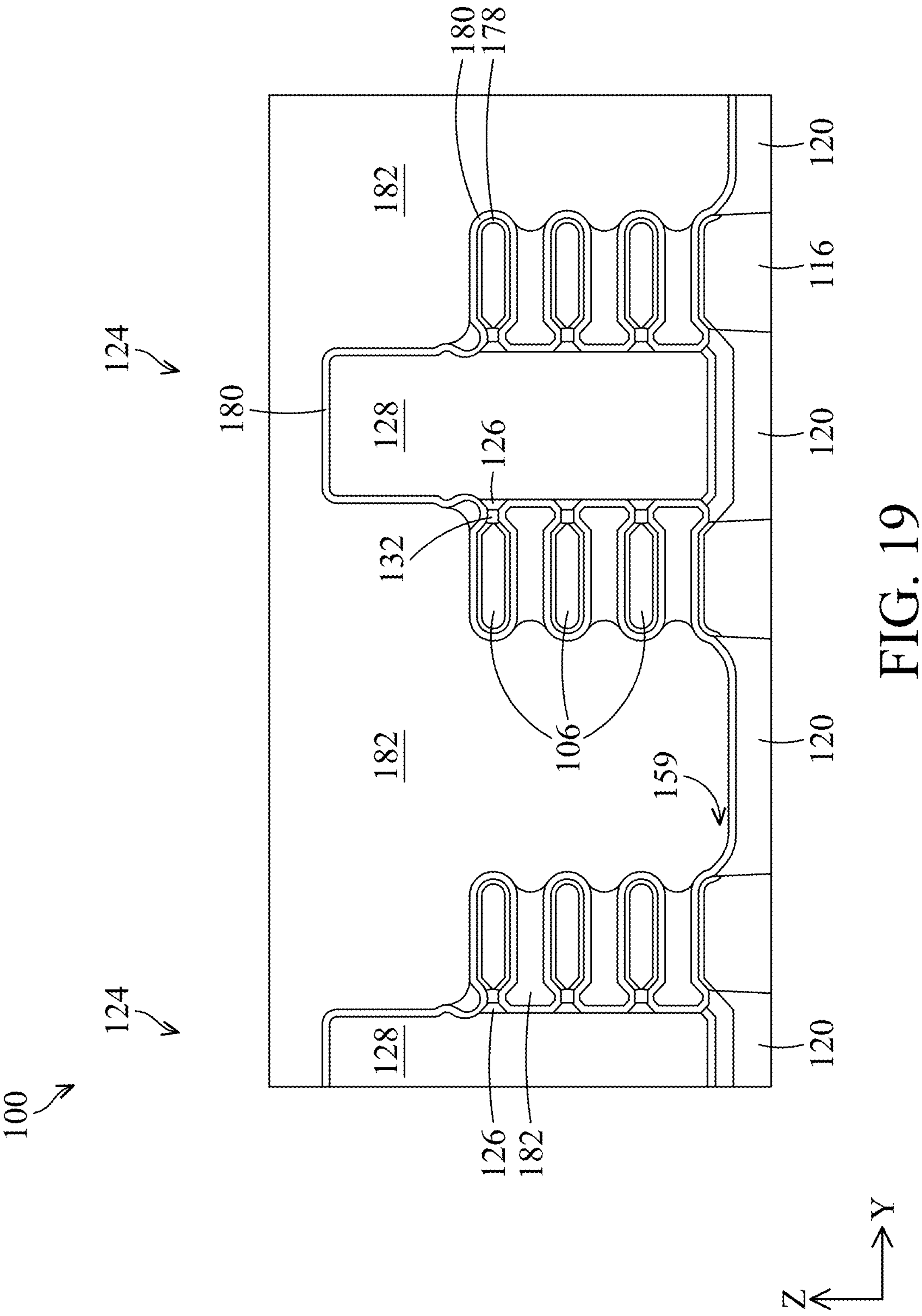

In FIG. 18, portions of the stack of semiconductor layers 104 are removed. In some embodiments, the second semiconductor layers 108 are removed such that the first semiconductor layers 106 remain and are separate from each other in the trenches 155. In some embodiments, the first semiconductor layers 106 are coupled to the first dielectric wall 124 through the cap layer 132 and the liner 126, forming a forksheet-like isolation structure. In some embodiments, the first semiconductor layers 106 remaining in the trenches 155 are further trimmed. In such cases, each of the first semiconductor layers 106 is trimmed to have a predetermined shape and dimensions (i.e., thickness and width). By adjusting the width and the thickness of the first semiconductor layers 106, a threshold voltage (Vt) of a FET device to be formed can be adjusted to meet requirements. Furthermore, in such embodiments, the cap layer 132 and the liner 126 may be consumed. Accordingly, a thickness of the cap layer 132 and a thickness of the liner 126 are reduced. In some alternative embodiments, the cap layer 132 and the liner 126 exposed through the trenches 155 may be entirely consumed such that the first semiconductor layers 106 are suspended in the trenches 155 and physically separated from the dielectric layer 128.

An interfacial layer (IL) 178 is then formed to surround at least three surfaces (except for the surface being in contact with the cap layer 132) of the first semiconductor layers 106. The IL 178 may form on the first semiconductor layers 106 but not the cap layer 132 or the liner 126. In some embodiments, the IL 178 may also form on the exposed surfaces of the well portion 116 of the substrate 101. The IL 178 may include or be made of an oxygen-containing material or a silicon-containing material, such as silicon oxide, silicon oxynitride, oxynitride, hafnium silicate, etc. The IL 178 may be formed by CVD, ALD or any suitable conformal deposition technique.

Next, a high-K (HK) dielectric layer 180 is formed on the exposed surfaces of the semiconductor device structure 100. In some embodiments, the HK dielectric layer 180 is formed on the IL 178, the isolation region 120, the cap layer 132, the liner 126, and the dielectric layer 128. The HK dielectric layer 180 may include or be made of hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride ($HfO_xN_y$), other suitable high-k materials, other suitable metal-oxides, or combinations thereof. The HK dielectric layer 180 may be a conformal layer formed by a conformal process, such as an ALD process or a CVD process. The HK dielectric layer 180 may have a thickness of about 0.1 nm to about 3 nm, which may vary depending on the application.

After formation of the IL and the HK dielectric layer 180, a gate electrode layer 182 is formed over the substrate 101 to cover the HK dielectric layer 180. The gate electrode layer 182 filles the trenches 155 (FIG. 18) and surrounds a portion of each of the first semiconductor layers 106. Therefore, the gate electrode layer 182 reaches the regions between two neighboring first semiconductor layers 106 of each fin structure 112. The gate electrode layer 182 includes one or more layers of conductive material, such as polysilicon, aluminum, copper, titanium, tantalum, tungsten, cobalt, molybdenum, tantalum nitride, nickel silicide, cobalt silicide, TIN, WN, WCN, TiAl, TiTaN, TiAIN, TaN, TaCN, TaC, TaSiN, metal alloys, other suitable materials, and/or combinations thereof. The gate electrode layers 182 may be formed by PVD, CVD, ALD, electro-plating, or other suitable method. While not shown, one or more optional conformal layers can be conformally (and sequentially, if more than one) deposited between the HK dielectric layer 180 and the gate electrode layer 182. The one or more optional conformal layers can include one or more barrier and/or capping layers and one or more work-function tuning layers. The one or more barrier and/or capping layers may include or be a nitride, silicon nitride, carbon nitride, and/or aluminum nitride of tantalum and/or titanium; a nitride, carbon nitride, and/or carbide of tungsten; the like; or a combination thereof. The one or more work-function tuning layers may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

Figure 20:
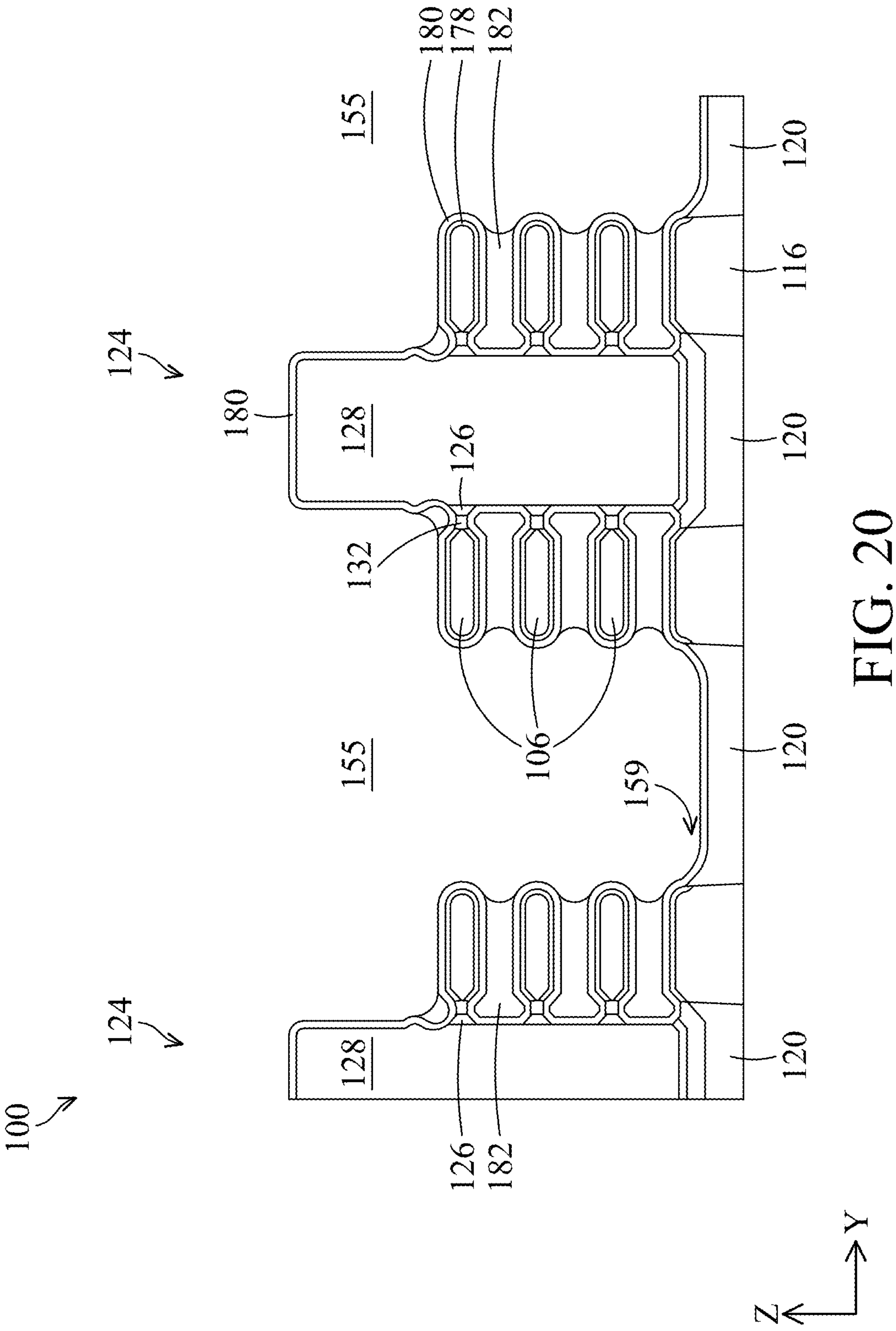

In FIG. 20, a metal gate etch back (MGEB) process is performed on the gate electrode layer 182. Accordingly, portions of the gate electrode layer 182 are removed. In some embodiments, the etch back process is performed such that the gate electrode layer 182 remains between the first semiconductor layers 106. The removal of the portions of the gate electrode layer 182 reveals portions of the trenches 155.

Figure 21:
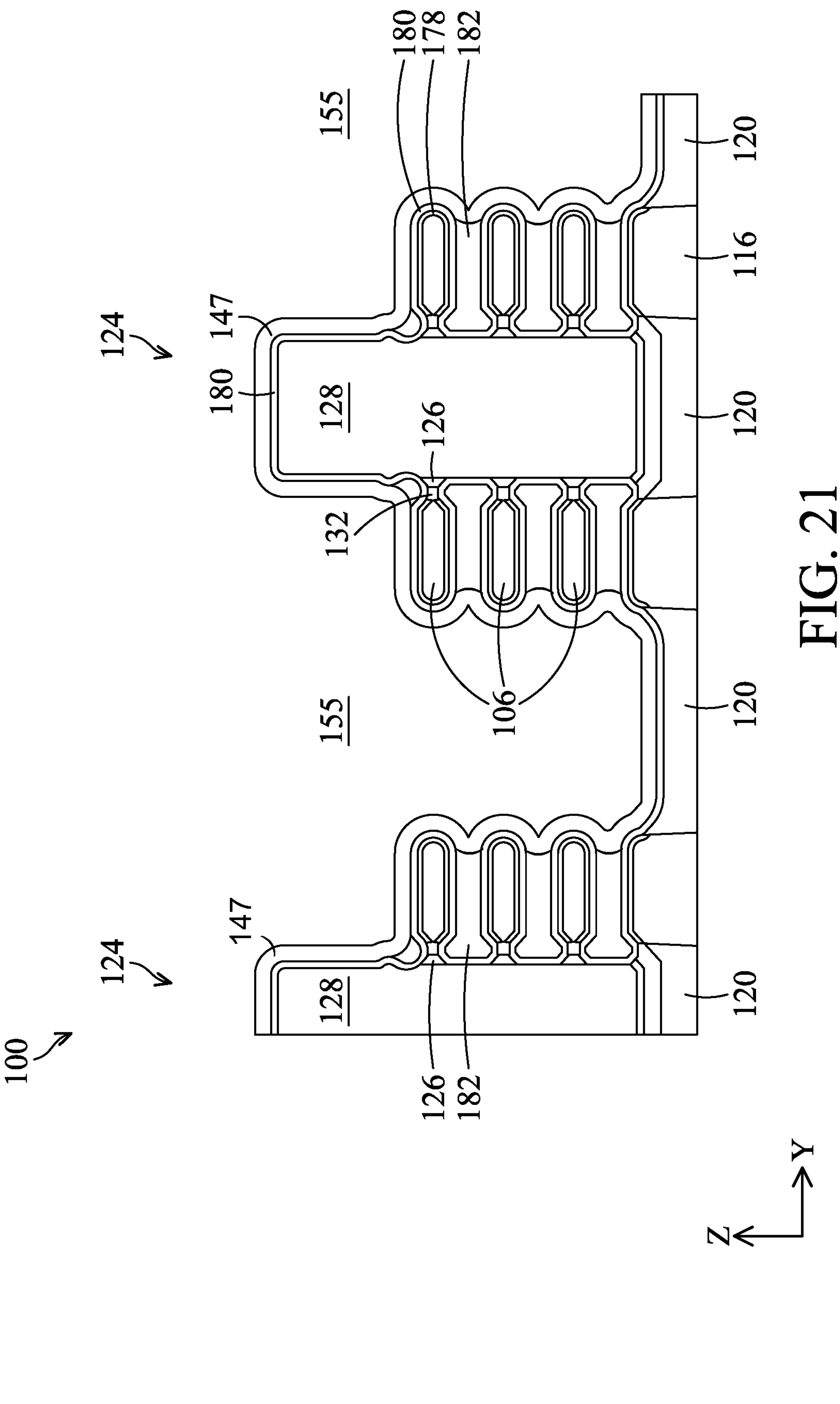

In FIG. 21, a hard mask layer 147 is conformally formed on the HK dielectric layer 180 and the gate electrode layer 182. The hard mask layer 147 protects the HK dielectric layer 180, the gate electrode layer 182, and the first semiconductor layers 106 from being damaged during the subsequent processes. The hard mask layer 147 may be formed of a dielectric material, such as SiN, SiCN, SiOC, SiOCN, $Al_2O_3$, or the like, and may be deposited by any suitable deposition process such as PVD, CVD, ALD, etc.

Figure 22:
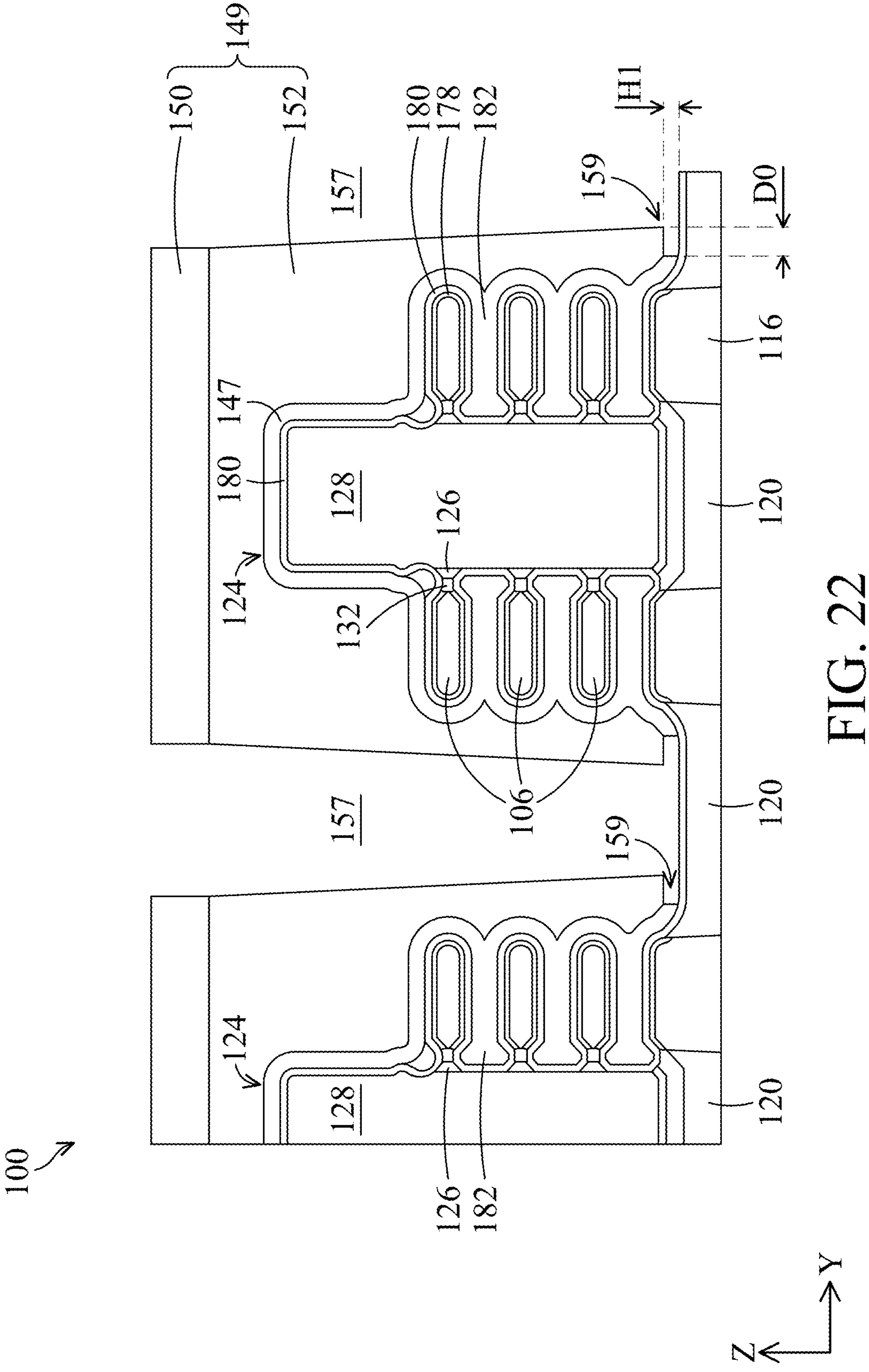

In FIG. 22, a protection structure 149 is formed in the trenches 155. The protection structure 149 may be deposited to cover at least the first dielectric wall 124 and the first semiconductor layers 106 at two opposing sides of the first dielectric wall 124. In some embodiments, the protection structure 149 may include at least a resist layer 150 and a bottom anti-reflective coating (BARC) layer 152 disposed between the resist layer 150 and the hard mask layer 147. The resist layer 150 is patterned to form trenches 157. The patterned resist layer 150 is used as a mask during a subsequent process, such as one or more photolithographic and etch processes, to transfer the pattern (i.e., trenches 157)

in the resist layer 150 into the BARC layer 152. The trenches 157 may extend through the entire thickness of the protection structure 149. In some embodiments, the trenches 157 may extend into the hard mask layer 147 to expose a portion of the HK dielectric layer 180 over the isolation region 120. The trenches 157 define isolation regions where a second dielectric wall 161 (FIG. 24) is to be formed. The isolation region may be disposed between neighboring fin structures 112 where no first dielectric wall 124 is present.

In some embodiments, the bottom of the trenches 157 may extend laterally into a region between the BARC layer 152 and the HK dielectric layer 180. The lateral etching to the bottom of the protection structure 149 ensures the hard mask layer 147 is fully removed at the bottom. The removal of the hard mask layer 147 at the bottom of the protection structure 149 forms a gap 159 between the BARC layer 152 and the HK dielectric layer 180. In some embodiments, the gap 159 has a height H1 that is substantially the same as the thickness of the hard mask layer 147 in contact with the HK dielectric layer 180. In some embodiments, the height H1 of the gap 159 is greater than the thickness of the hard mask layer 147 in contact with the HK dielectric layer 180. In some embodiments, the trenches 157 are extended through the HK dielectric layer 180 to expose the isolation region 120.

In some embodiments, the gap 159 may have a depth DO measuring from the end of the exposed hard mask layer 147 to a line extending along the sidewall of the bottom BARC layer 152. The depth DO may be in a range of about 0.1 nm to about 2.5 nm.

Figure 23:
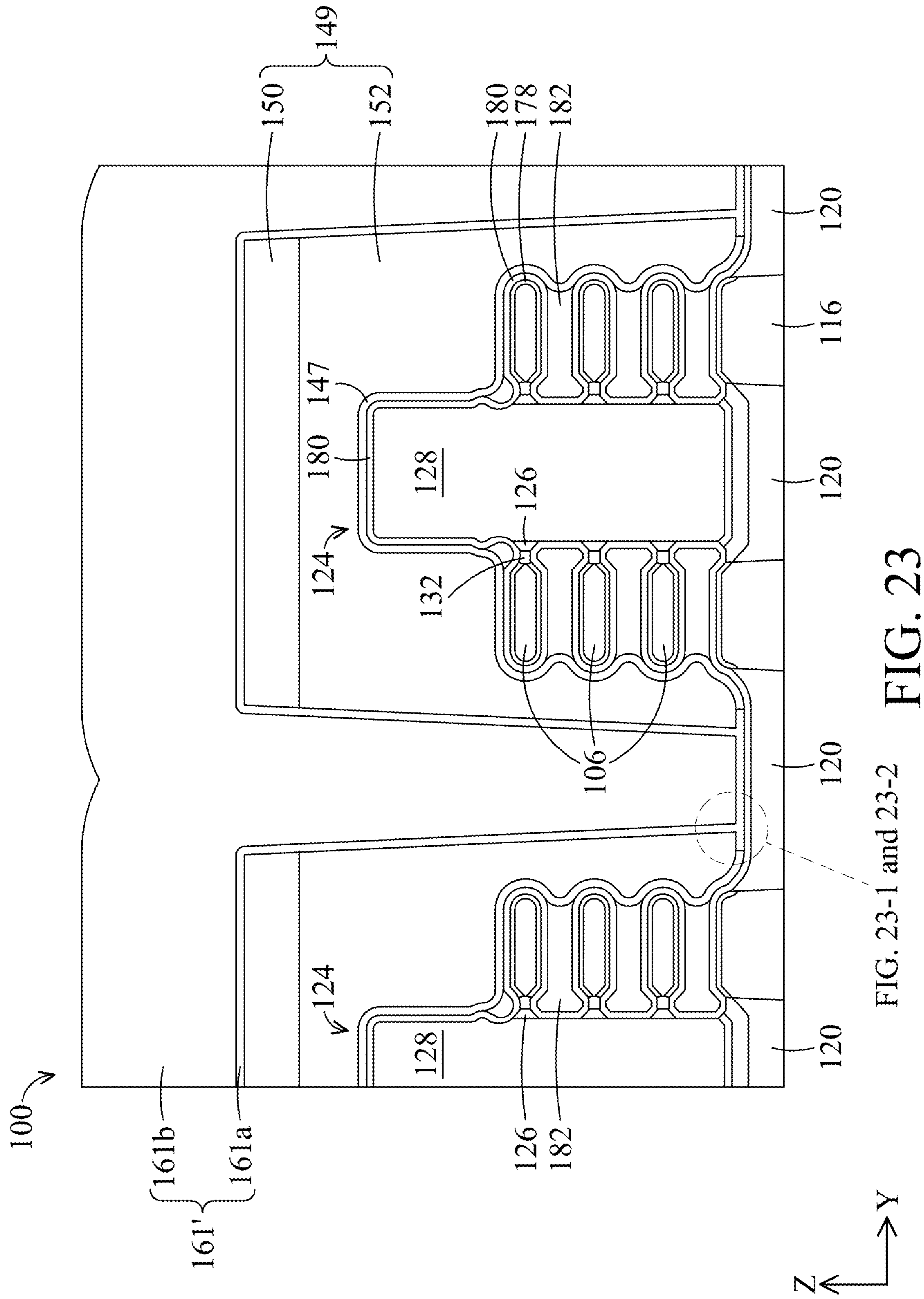
Figures 1, 23:
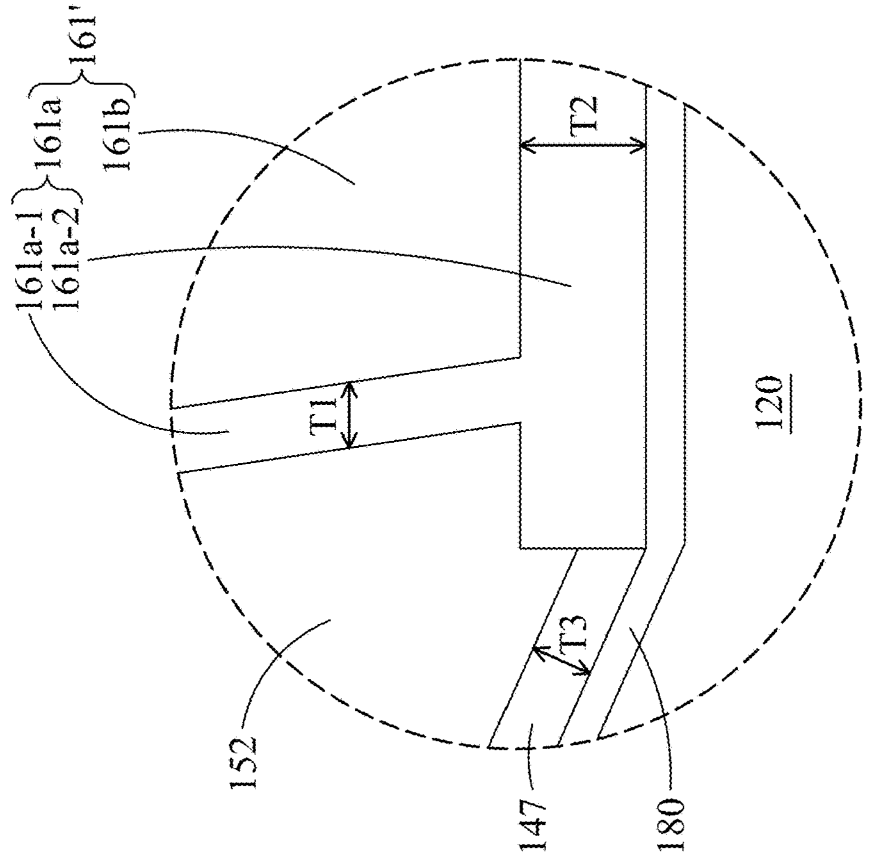
Figures 2, 23:
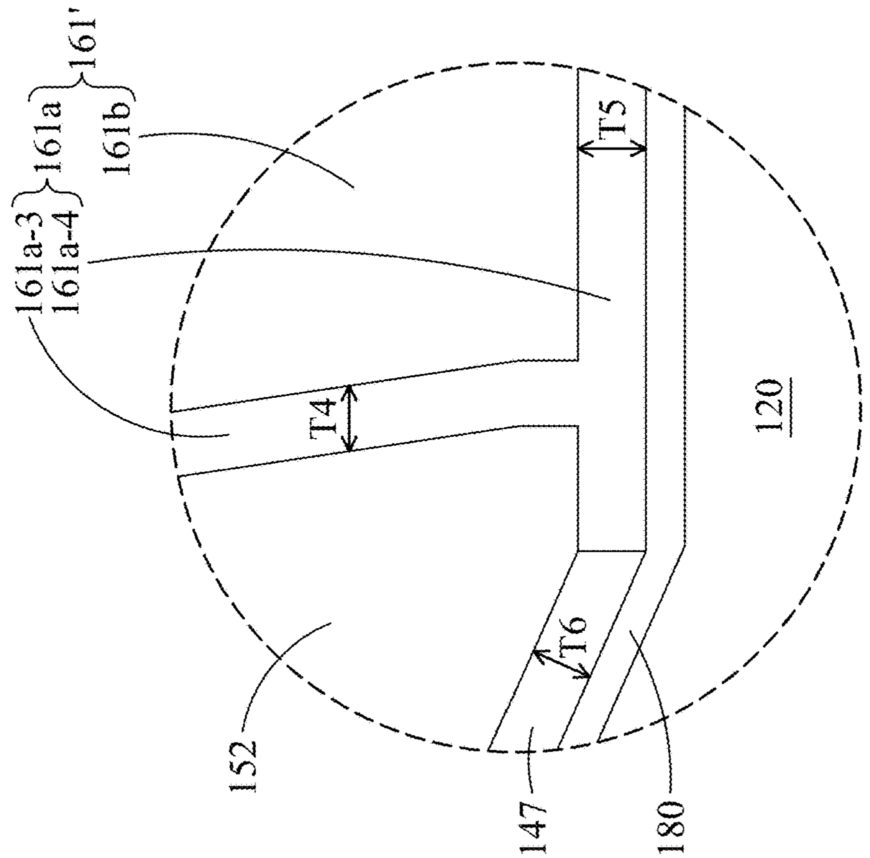

In FIG. 23, a dielectric structure 161' is formed to fill the trenches 157. The dielectric structure 161' may include a first dielectric layer 161*a* and a second dielectric layer 161*b* sequentially formed on the first dielectric layer 161*a*. The second dielectric layer 161*b* may have at least three surfaces in contact with the first dielectric layer 161*a*. The first dielectric layer 161*a* and the second dielectric layer 161*b* may include a material that is chemically different from each other. Exemplary materials for the first dielectric layer 161*a* may include, but are not limited to, oxides, $SiO_2$, SiN, SiON, $AlO_x$, $AlSiO_x$, $AlSiO_xN_y$, or other suitable dielectric material. Exemplary materials for the second dielectric layer 161*b* may include, but are not limited to, oxides, $SiO_2$, SiN, SION, $AlO_x$, $AlSiO_x$, $AlSiO_xN_y$, or other suitable dielectric material. For example, the first dielectric layer 161*a* may include silicon oxide, and the second dielectric layer 161*b* may include silicon nitride. In some embodiments, the first and second dielectric layers 161*a*, 161*b* include the same material. In some embodiments, the materials for the first dielectric layer 161*a* and the second dielectric layer 161*b* may be the same or different than the materials for the liner 126 and the dielectric layer 128. For example, the liner 126 and the first dielectric layer 161*a* may include the same or different material from each other, and the dielectric layer 128 and the second dielectric layer 161*b* may include the same or different material from each other.

In some embodiments, the first dielectric layer 161*a* is conformally formed to cover exposed surfaces of the resist layer 150, the BARC layer 152, and the HK dielectric layer 180 exposed through the trenches 157. In cases where the hard mask layer 147 at the bottom of the trenches 157 is removed, the first dielectric layer 161*a* is deposited on the isolation region 120. The first dielectric layer 161*a* is also deposited to fill in the gaps 159. After the first dielectric layer 161*a* is formed, the second dielectric layer 161*b* is deposited on the first dielectric layer 161*a*. The second dielectric layer 161*b* fills in the trenches 157 and is deposited until the trenches 157 are overfilled. The dielectric structure 161' may be formed by any suitable method, such as a low-pressure chemical vapor deposition (LPCVD), plasma enhanced CVD (PECVD) or flowable CVD (FCVD). The first and the second dielectric layers 161*a*, 161*b* may be deposited in a low-temperature range (e.g., about 200 to about 400 degrees Celsius) to avoid source/drain features or other transistor devices from being damaged.

FIGS. 23-1 and 23-2 illustrate an enlarged view of a portion of the semiconductor device structure 100, in accordance with some embodiments of the present disclosure. In the embodiment shown in FIG. 23-1, the dielectric structure 161' includes a first portion 161*a*-1 and a second portion 161*a*-2 connecting to the first portion 161*a*-1. The first portion 161*a*-1 has a first thickness T1 and the second portion 161*a*-2 has a second thickness T2 that is greater than the first thickness T1. The difference between the first thickness T1 and the second thickness T2 is due partially to the removal of the hard mask layer 147 at the bottom of the trenches 157, and the second thickness T2 may vary depending on the height H1 of the gap 159, as discussed above with respect to FIG. 22. In some embodiments, the hard mask layer 147 has a third thickness T3 that is less than the second thickness T2 of the second portion 161*a*-2 of the dielectric structure 161'.

In the embodiment shown in FIG. 23-2, the dielectric structure 161' includes a first portion 161*a*-3 and a second portion 161*a*-4 connecting to the first portion 161*a*-3. The first portion 161*a*-3 has a first thickness T4 and the second portion 161*a*-4 has a second thickness T5 that is substantially identical to the first thickness T4. In some embodiments, the hard mask layer 147 has a third thickness T6 that is substantially identical to the second thickness T5 of the second portion 161*a*-4 of the dielectric structure 161'.

Figure 24:
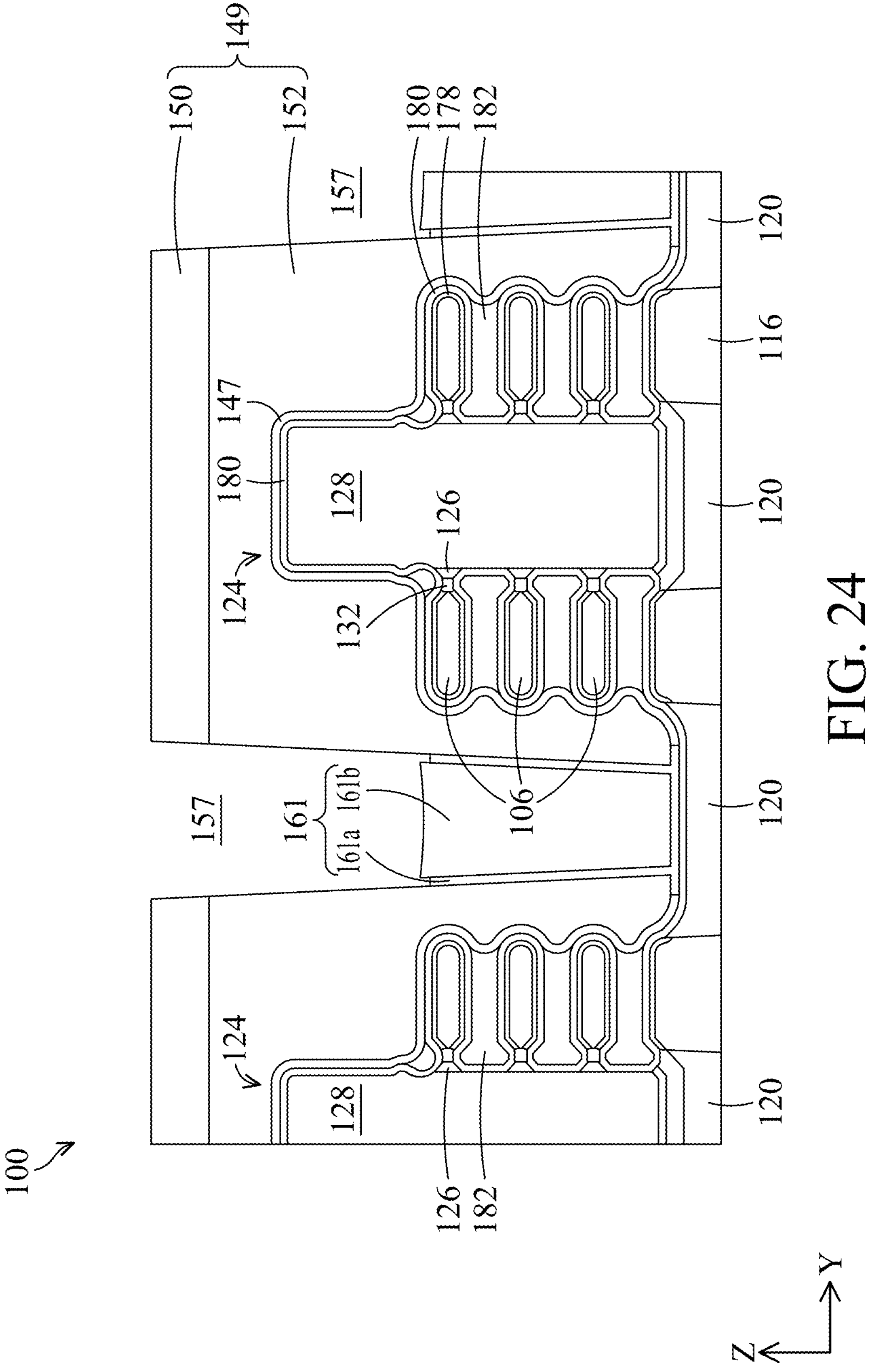

In FIG. 24, an etch-back process is performed to remove portions of the dielectric structure 161', thereby forming a second dielectric wall 161. The second dielectric wall 161 may serve as a cut metal gate (CMG) isolation structure. Particularly, the second dielectric wall 161 is embedded in the gate electrode layer (e.g., metal layer 169) to be formed in the trenches 157 and therefore reduces the amount of the gate electrode layer between the neighboring transistors that would otherwise induce large gate-to-S/D parasitic capacitance. As a result, the gate-to-S/D parasitic capacitance of the semiconductor device structure 100 is reduced. The etch-back process may be a selective etch process that removes the first and second dielectric layers 161*a*, 161*b* but not the resist layer 150 and the BARC layer 152. The etch-back process may be performed on the dielectric structure 161' such that a top surface of the first dielectric layer 161*a* and a top surface of the second dielectric layer 161*b* are substantially coplanar. In some embodiments, the etch-back process is performed such that the top surface of the first dielectric layer 161*a* is slightly lower than the top surface of the second dielectric layer 161*b*. In some embodiments, the etch-back process is performed such that the top surface of the first dielectric layer 161*a* is slightly higher than the top surface of the second dielectric layer 161*b*. In some embodiments, the etch-back process is performed such that the top surface of the first or second dielectric layer 161*a*, 161*b* is at an elevation lower than or substantially level with a top surface of the topmost first semiconductor layer 106. In some embodiments, the etch-back process is performed such that the top surface of the first or second dielectric layer 161*a*, 161*b* is at an elevation higher than the top surface of the topmost first semiconductor layer 106. The height of the second dielectric wall 161 controls the amount of the gate electrode layer to be formed thereon and therefore, it can effectively affect the gate-to-source/drain parasitic capacitance. Having the top surface of the second dielectric layer 161*b* disposed at an elevation higher than the top surface of the topmost first semiconductor layer 106 reduces the value of the capacitance. As a result, a better effective capacitance (Ceff) gain is obtained.

In some embodiments, the etch-back process may be performed such that one or more second dielectric walls 161 at a first device region have a first height and one or more second dielectric walls 161 at a second device region have a second height that is different (e.g., greater or less) than the first height.

Figure 25:
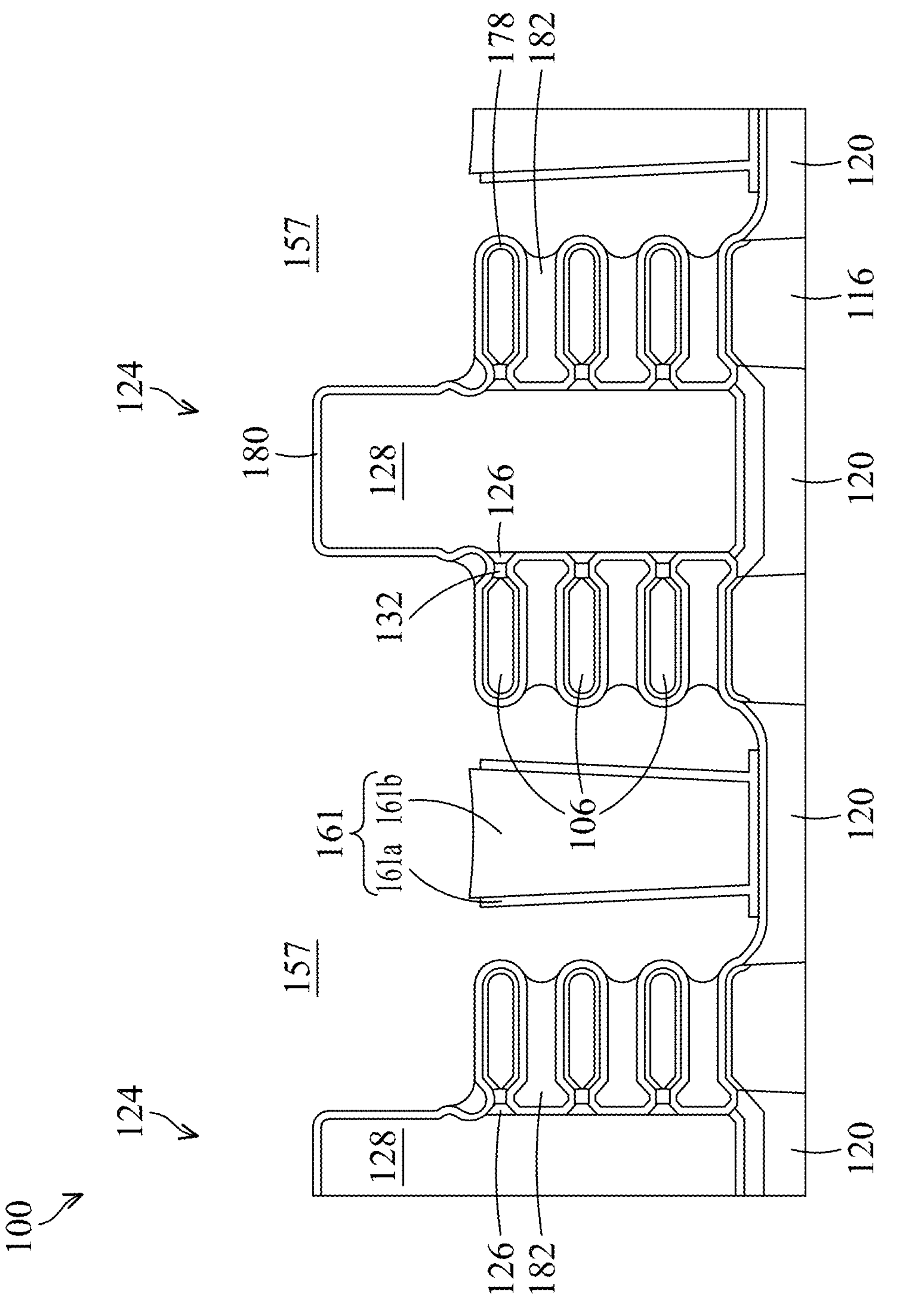

In FIG. 25, the protection structure 149 and the hard mask layer 147 are removed. The protection structure 149 and the hard mask layer 147 may be removed using one or more etch processes. The one or more etch processes may be a selective and/or time-controlled etch process that removes the protection structure 149 and the hard mask layer 147 without substantially affecting the HK dielectric layer 180, the second dielectric wall 161, and the gate electrode layer 182. The removal of the protection structure 149 and the hard mask layer 147 reveals the trenches 157.

Figure 26:
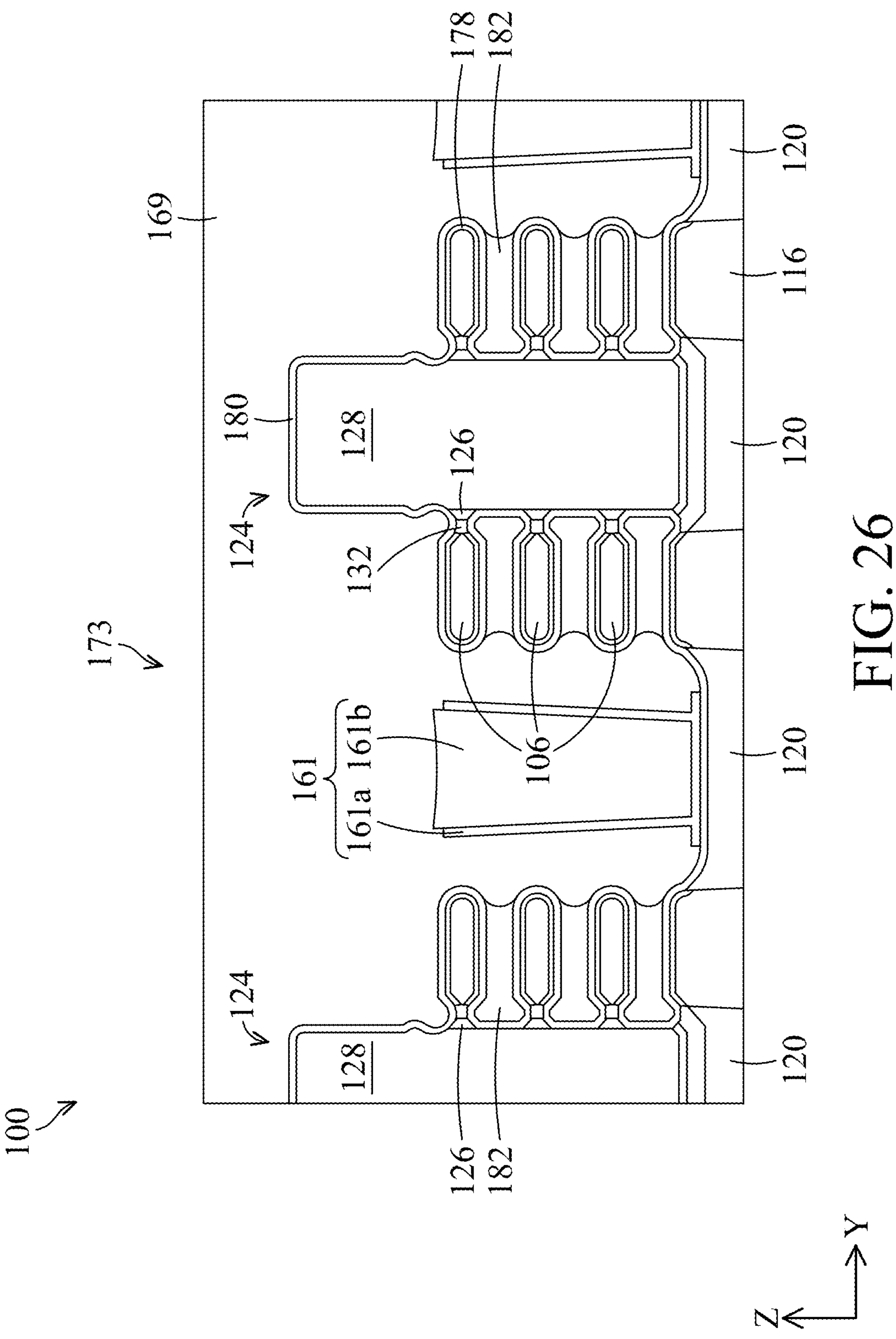

In FIG. 26, a metal layer 169 is formed to fill the trenches 157. The metal layer 169 serves as a gap-filling layer and becomes part of the gate electrode layer for the semiconductor device structure 100. Portions of the metal layer 169 are recessed, and the recessed metal layer 169 is combined with the gate electrode layer 182 to form a metal gate structure 173. Each channel layer (i.e., first semiconductor layer 106) is wrapped around by the metal gate structure 173. The metal layer 169 may use a material selected from the material used for the gate electrode layer 182. In some embodiments, the metal layer 169 and the gate electrode layer 182 may include the same material. In some embodiments, the metal layer 169 and the gate electrode layer 182 may include a material different from each other. The metal layer 169 covers the exposed surfaces of the first and second dielectric walls 124, 161, and are in contact with the gate electrode layer 182 exposed through the trenches 157. The metal layer 169 may be formed using the same fashion as the gate electrode layer 182, and may be deposited to a height over a top surface of the first dielectric wall 124.

Figure 27:
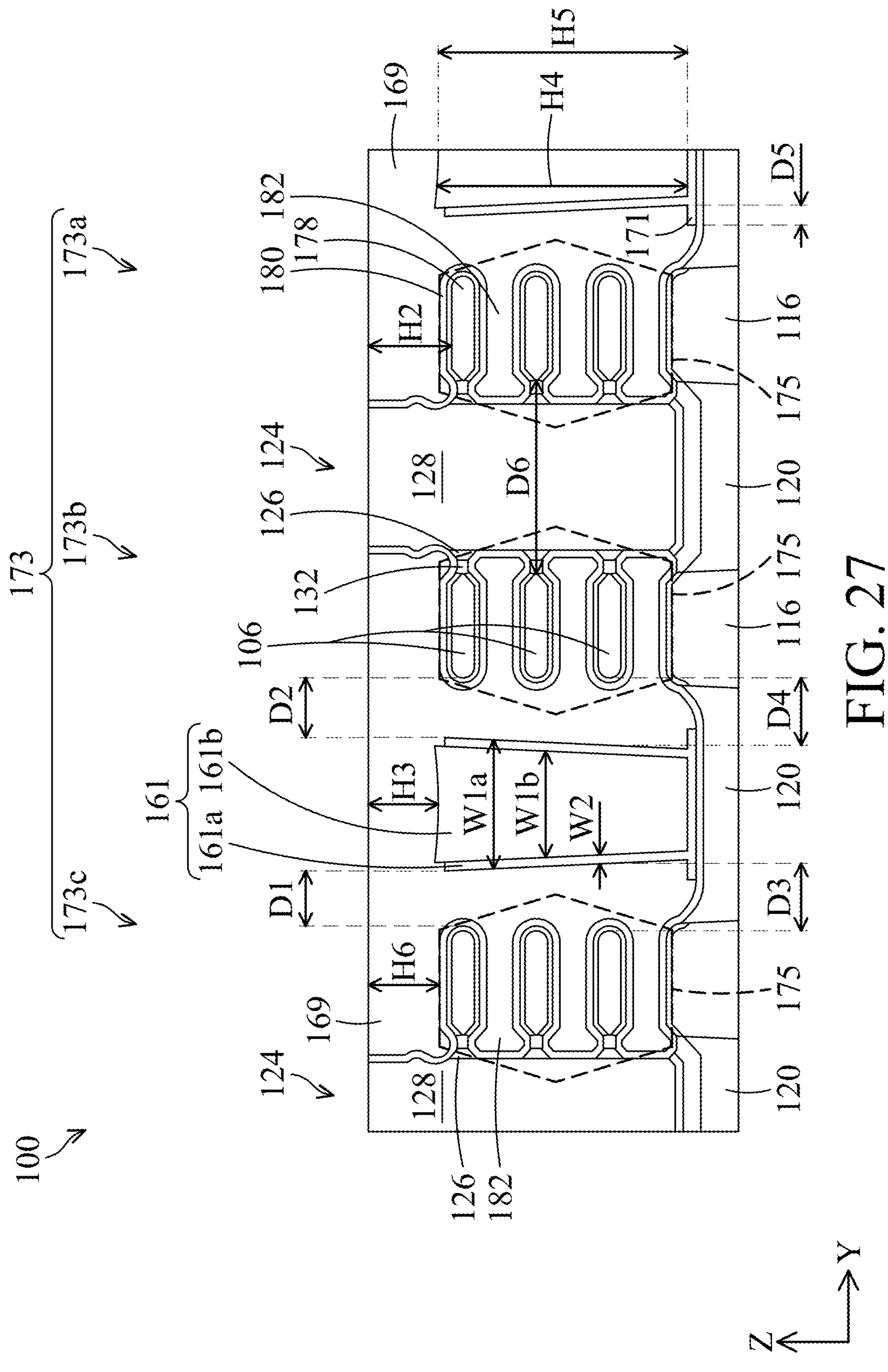
Figure 28:
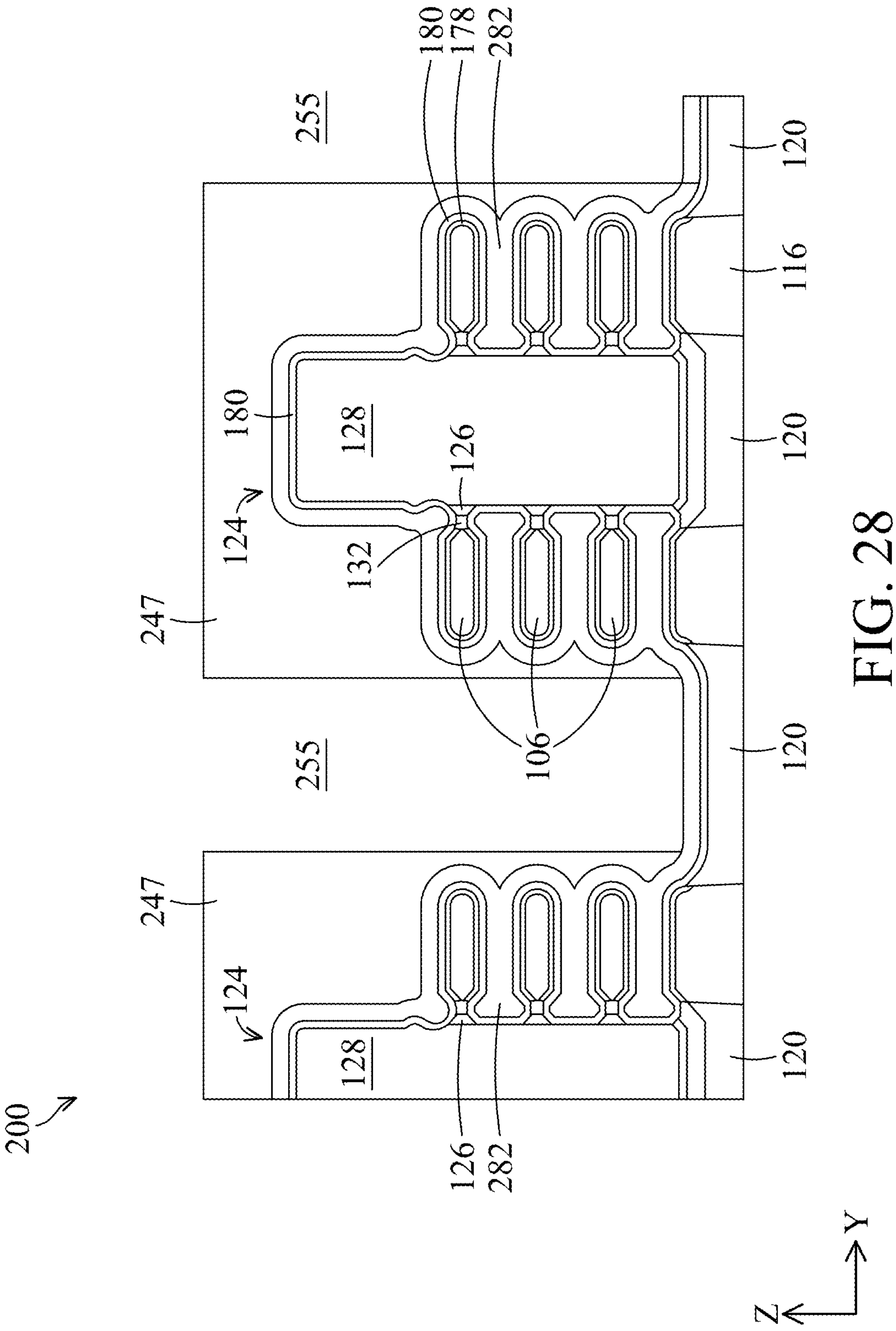

In FIG. 27, a planarization process, such as CMP, is performed on the semiconductor device structure 100. The planarization process may be performed until the dielectric layer 128 of the first dielectric wall 124 is exposed. In some embodiments, the planarization process is performed to remove portions of the metal layer 169, the HK dielectric layer 180, and the dielectric layer 128 of the first dielectric wall 124. Upon completion of the planarization process, the top surfaces of the metal layer 169, the HK dielectric layer 180, and the dielectric layer 128 of the first dielectric wall 124 are substantially co-planar. In some embodiments, the metal gate structure 173 may include a first metal gate structure portion 173*a*, a second metal gate structure portion 173*b*, and a third metal gate structure portion 173*c*. The first metal gate structure portion 173*a* and the second metal gate structure portion 173*b* are separated from each other by the first dielectric wall 124. The second metal gate structure portion 173*b* and the third metal gate structure portion 173*c* are separated from each other by the second dielectric wall 161. Each of the metal gate structure portions 173*a*, 173*b*, 173*c* includes the plurality of first semiconductor layers 106 vertically stacked over the substrate 101 and separated from each other, the HK dielectric layer 180 covering each of the first semiconductor layers 106, and the IL 178 disposed between the HK dielectric layer 180 and the first semiconductor layer 106.

The first dielectric wall 124 is disposed over the substrate 101 and is physically connected (through the liner 126 and the cap layer 132) to first semiconductor layers 106 disposed on opposing sides of the first dielectric wall 124. The second dielectric wall 161 is disposed over the substrate 101 and physically separates the second metal gate structure portion 173*b* and the third metal gate structure portion 173*c* from each other. The metal gate structure 173 disposed over the second dielectric wall 161 electrically connects the second metal gate structure portion 173*b* and the third metal gate structure portion 173*c*. If the second dielectric wall 161 completely separates the second metal gate structure portion 173*b* and the third metal gate structure portion 173*c*, the subsequent via contact for the metal gate structure may land on the second dielectric wall 161 and render the electrical connection between the second metal gate structure portion 173*b* and the third metal gate structure portion 173*c* fail. Since the second dielectric wall 161 occupies portions of the metal gate structure 173, the effective capacitance Ceff) of the metal gate structure 173 is decreased. As a result, the gate-to-S/D (represented by dashed lines 175) parasitic capacitance (Cgd) is reduced.

In some embodiments, the planarization process may be performed such that a top surface of the metal layer 169 is at an elevation higher than a top surface of the topmost first semiconductor layer 106. For example, the planarization process may be performed such that a distance H2 between the top surface of the metal layer 169 and the top surface of the topmost first semiconductor layer 106 is in a range of about 3 nm to about 30 nm.

In some embodiments, the planarization process may be performed such that a distance H3 between the top surface of the metal layer 169 and a top surface of the second dielectric layer 161*b* of the second dielectric wall 161 is in a range of about 1 nm to about 50 nm. The distance H3 may be the same or different than the distance H2. In some embodiments, the planarization process is performed until the top surface of the first dielectric layer 161*a* or the second dielectric layer 161*b* is exposed. In other words, the distance H3 is 0 nm. In such cases, the transistor device on one side of the second dielectric wall 161 is separated or isolated from the transistor device on the opposing side of the second dielectric wall 161. In some embodiments, the second dielectric walls 161 at a first device region may have a first height and the second dielectric walls 161 at a second device region may have a second height different than the first height, and such a difference between the first height and the second height may result in the metal layer 169 to leave with a different height H6 (a distance between the top surface of the metal layer 169 and the top surface of the HK dielectric layer 180 over the topmost first semiconductor layer 106) between the first and second device regions.

In some embodiments, the metal gate end cap space on the left side of the second dielectric wall 161 may have a distance D1 and the metal gate end cap space on the right side of the second dielectric wall 161 may have a distance D2 that is the same or different than the distance D1. The term "metal gate end cap space" herein refers to a distance measuring from the end of the first semiconductor layer 106 to the first dielectric layer 161*a* of the second dielectric wall 161. In various embodiments, the distances D1 and D2 may vary in a range of about 3 nm to about 30 nm.

In some embodiments, the metal gate end cap space (e.g., distance D1) of the topmost first semiconductor layer 106 and the metal gate end cap space (e.g., distance D3) of the bottommost first semiconductor layer 106 on the left side of the second dielectric wall 161 are different from each other. The difference between the distance D1 and D3 may be in a range of 0 nm (meaning the second dielectric wall 161 has a vertical sidewall) to about 5 nm.

In some embodiments, the metal gate end cap space (e.g., distance D2) of the topmost first semiconductor layer 106 and the metal gate end cap space (e.g., distance D4) of the bottommost first semiconductor layer 106 on the right side of the second dielectric wall 161 are different from each other. The difference between the distance D2 and D4 may be in a range of 0 nm (meaning the second dielectric wall 161 has a vertical sidewall) to about 5 nm.

In some embodiments, the metal gate end cap space (e.g., distance D3) of the bottommost first semiconductor layer 106 on the left side of the second dielectric wall 161 and the metal gate end cap space (e.g., distance D4) of the bottommost first semiconductor layer 106 on the right side of the second dielectric wall 161 may be the same or different from each other. In various embodiments, the distances D3 and D4 may vary in a range of about 3 nm to about 30 nm.

In some embodiments, the second dielectric wall 161 may have a width W1*a* in a range of about 0.5 nm to about 48 nm. The width W1*a* is measured by combining the thickness of the first dielectric layer 161*a* and the second dielectric layer 161*b*, and may be measured at an elevation between a first and a second topmost first semiconductor layer 106. In some embodiments where the second dielectric wall 161 has an angled sidewall (i.e., not vertically straight), the second dielectric wall 161 may have a width W1*b* in a range of about 5 nm to about 50 nm, and may be measured at an elevation between the second and a third topmost first semiconductor layer 106.

In some embodiments, the second dielectric layer 161*b* may have a width W2 in a range of about 2 nm to about 4.5 nm.

In some embodiments, the second dielectric layer 161*b* of the second dielectric wall 161 may have a height H4 in a range of about 0.5 nm to about 60 nm. The second dielectric wall 161 may have a height H5 in a range of about 5 nm to about 60 nm. The height H5 is measured from a bottom of the first dielectric layer 161*a* to a top of the first dielectric layer 161*a* or the second dielectric layer 161*b*. The height H4 and H5 may be different from each other.

In some embodiments, the first dielectric layer 161*a* of the second dielectric wall 161 has a footing 171 extended laterally from the bottom of the second dielectric wall 161. The footing 171 may have a depth D5 that is equal to the depth DO (FIG. 22). The depth D5 may be in a range of about 0.1 nm to about 2.5 nm.

In some embodiments, a distance D6 between corresponding first semiconductor layers 106 at two opposing sides of the first dielectric wall 124 is equal to or greater than the width of the first dielectric wall 124. The distance D6 herein refers to a distance between two adjacent active regions, that is, an OD-to-OD distance.

FIGS. 28-35 are cross-sectional side views of various stages of manufacturing a semiconductor device structure 200, in accordance with some alternative embodiments. This alternative embodiment is similar to the embodiment shown in FIGS. 1-27 except that after formation of the HK dielectric layer 180 (FIG. 18), a gate electrode layer 282 is conformally formed on the HK dielectric layer 180. The gate electrode layer 282 may include the same material as the gate electrode layer 182. The gate electrode layer 282 may be a conformal layer deposited by any suitable conformal deposition process. The gate electrode layer 282 may have a thickness in a range of about 0.5 nm to about 15 nm. Then, a mask layer 247 is formed in the trenches 155 (FIG. 18). The mask layer 247 is deposited on the gate electrode layer 282 to protect the first dielectric wall 124 and the first semiconductor layers 106 at two opposing sides of the first dielectric wall 124. A patterned resist layer (not shown) is then formed on the mask layer 247. One or more etch processes are performed, using the patterned resist layer as a mask, to remove portions of the mask layer 247 and form trenches 255. Each trench 255 is disposed between neighboring active regions and extends along a direction parallel to the longitudinal direction of the fin structures 112. Each trench 255 extends through the mask layer 247 to expose the gate electrode layer 282 over the isolation region 120.

Figure 29:
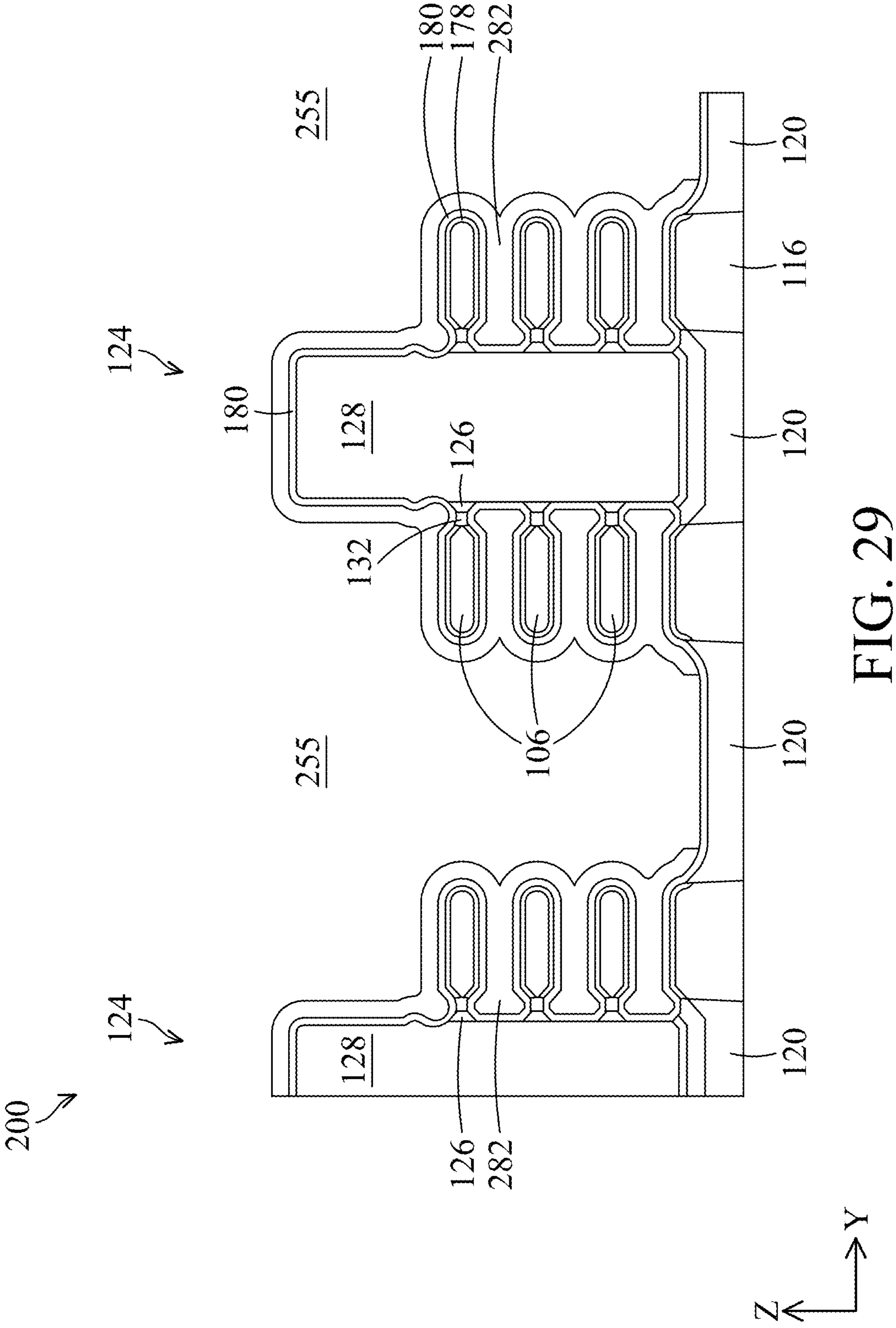

In FIG. 29, the gate electrode layer 282 exposed through the trenches 255 is removed, exposing a portion of the HK dielectric layer 180 over the isolation region 120. Thereafter, the mask layer 247 is removed. The removal of the mask layer 247 reveals the trenches 255. The gate electrode layer 282 and the mask layer 247 may be removed using one or more etch processes.

Figure 30:
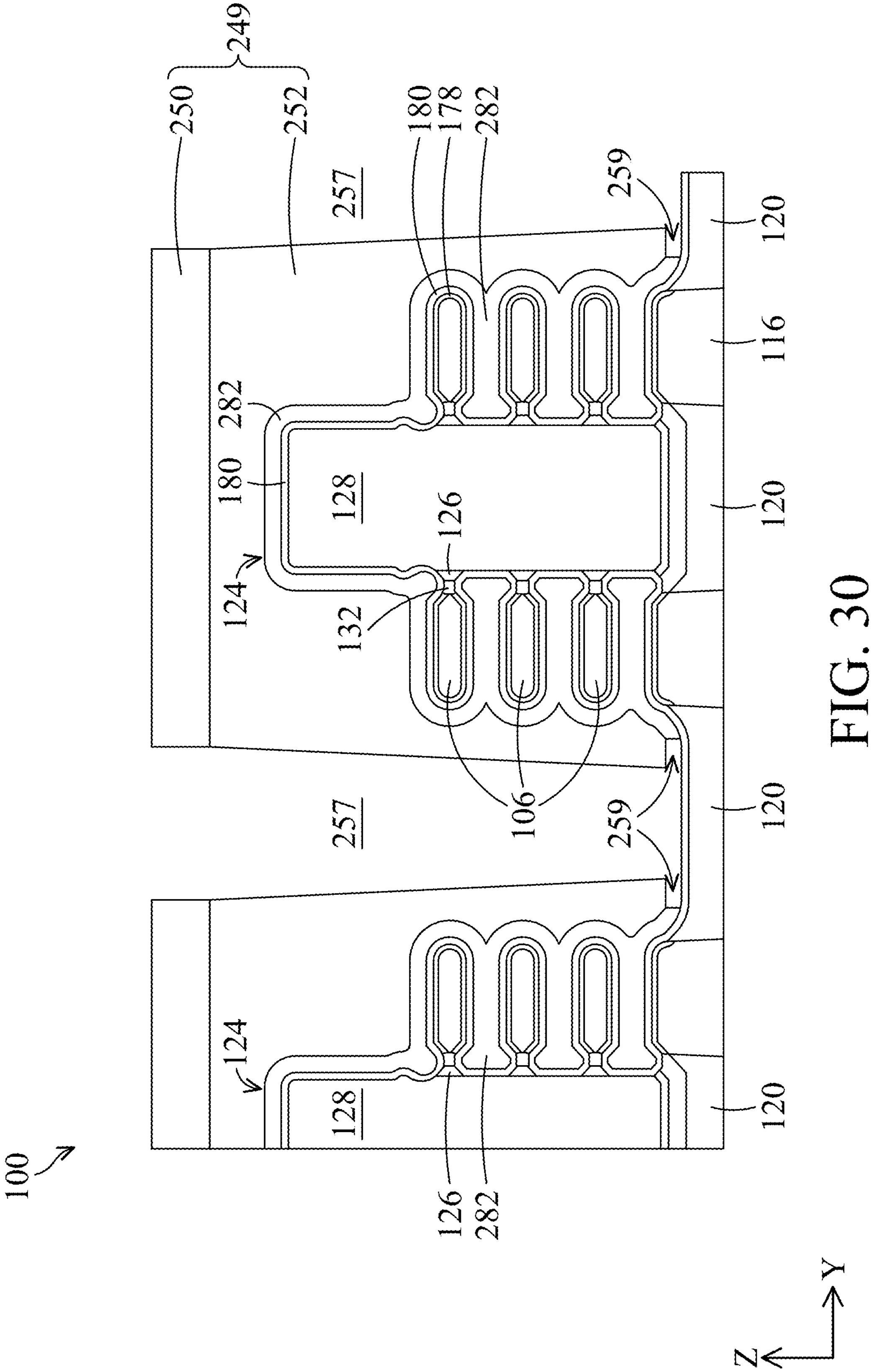

In FIG. 30, a protection structure 249 is formed in the trenches 255. The protection structure 249, like the protection structure 149 discussed above, may include a resist layer 250 and a BARC layer 252. The resist layer 250 is patterned and used as a mask to form trenches 257 extending through the BARC layer 252. The trenches 257 expose a portion of the HK dielectric layer 180 over the isolation region 120. Likewise, the trenches 257 define isolation regions where a second dielectric wall 161 (FIG. 35) is to be formed. The isolation region may be disposed between neighboring fin structures 112 where no first dielectric wall 124 is present. The bottom of the trenches 257 may extend laterally to form a gap 259. In some embodiments, the height of the gap 259 is greater than the thickness of the gate electrode layer 282 in contact with the HK dielectric layer 180. In some embodiments, the trenches 257 are extended through the HK dielectric layer 180 to expose the isolation region 120.

Figure 31:
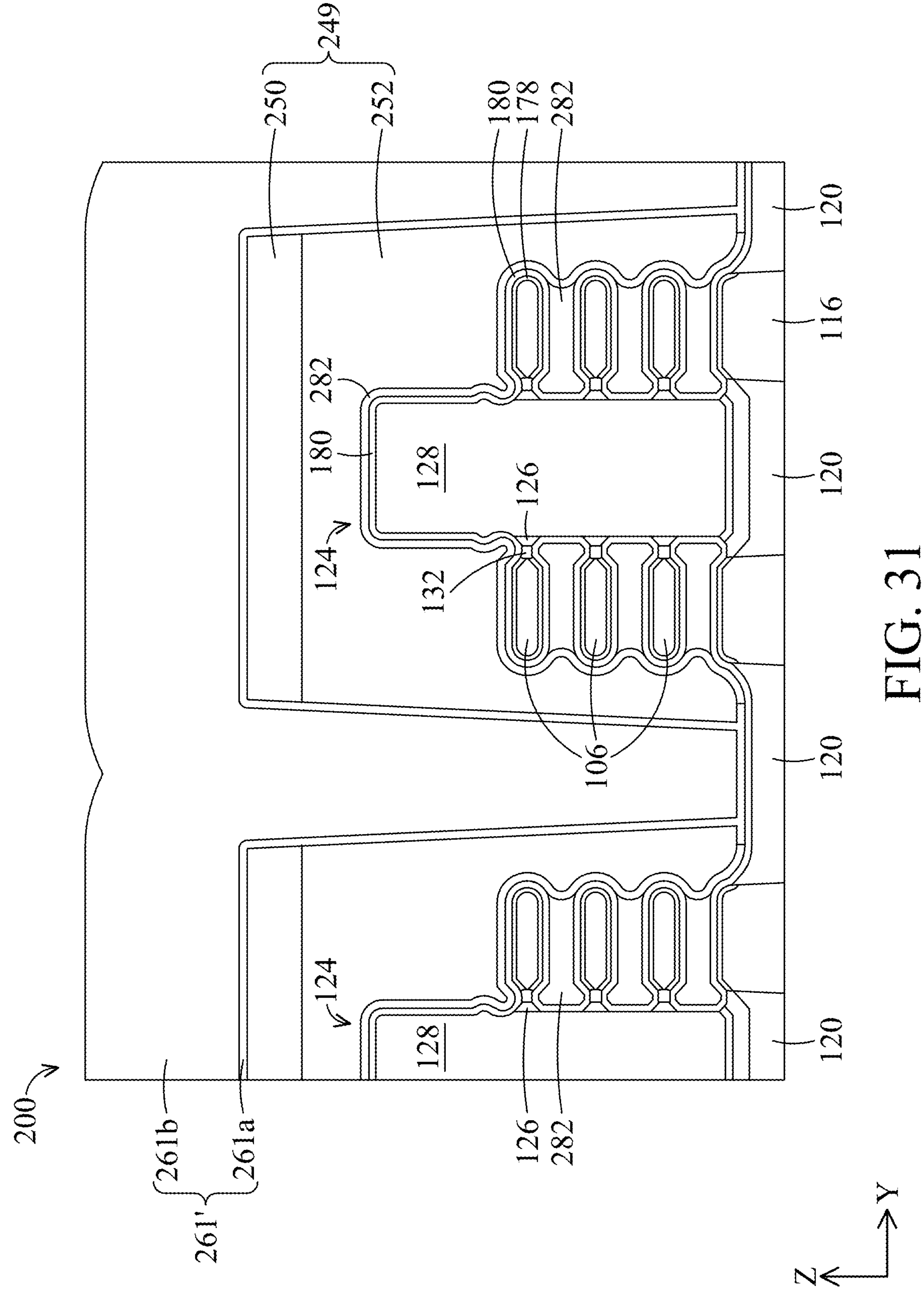

In FIG. 31, a dielectric structure 261' is formed to fill the trenches 257. The dielectric structure 261' may include a first dielectric layer 261*a* and a second dielectric layer 261*b* sequentially formed on the first dielectric layer 261*a*. The first and second dielectric layers 261*a*, 261*b* may include the same material as the first and second dielectric layers 161*a*, 161*b*, and may be deposited in the similar fashion as discussed above with respect to FIG. 23.

Figure 32:
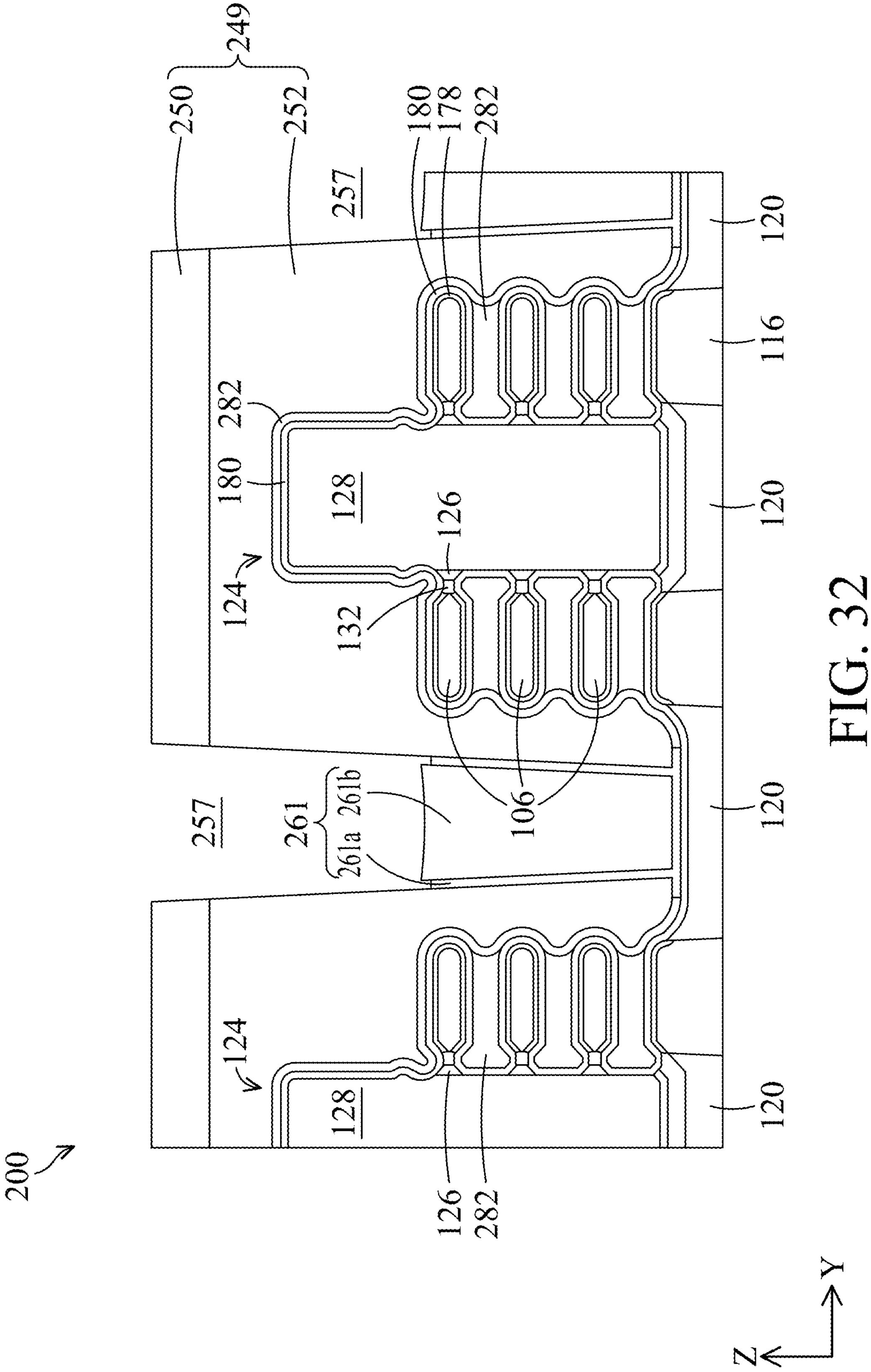

In FIG. 32, an etch-back process, such as the etch-back process discussed above with respect to FIG. 24, is performed to remove portions of the dielectric structure 261', thereby forming a second dielectric wall 261. Likewise, the etch-back process may be performed on the dielectric structure 261' such that a top surface of the first dielectric layer 261*a* and a top surface of the second dielectric layer 261*b* are substantially coplanar or at different heights. In some embodiments, the etch-back process is performed such that the top surface of the first or second dielectric layer 261*a*, 261*b* is at an elevation lower than or substantially level with a top surface of the topmost first semiconductor layer 106. In some embodiments, the etch-back process is performed such that the top surface of the first or second dielectric layer 261*a*, 261*b* is at an elevation higher than the top surface of the topmost first semiconductor layer 106. In some alternative embodiments, the etch-back process may be performed such that one or more second dielectric walls 261 at a first device region have a first height and one or more second dielectric walls 261 at a second device region have a second height that is different than the first height.

Figure 33:
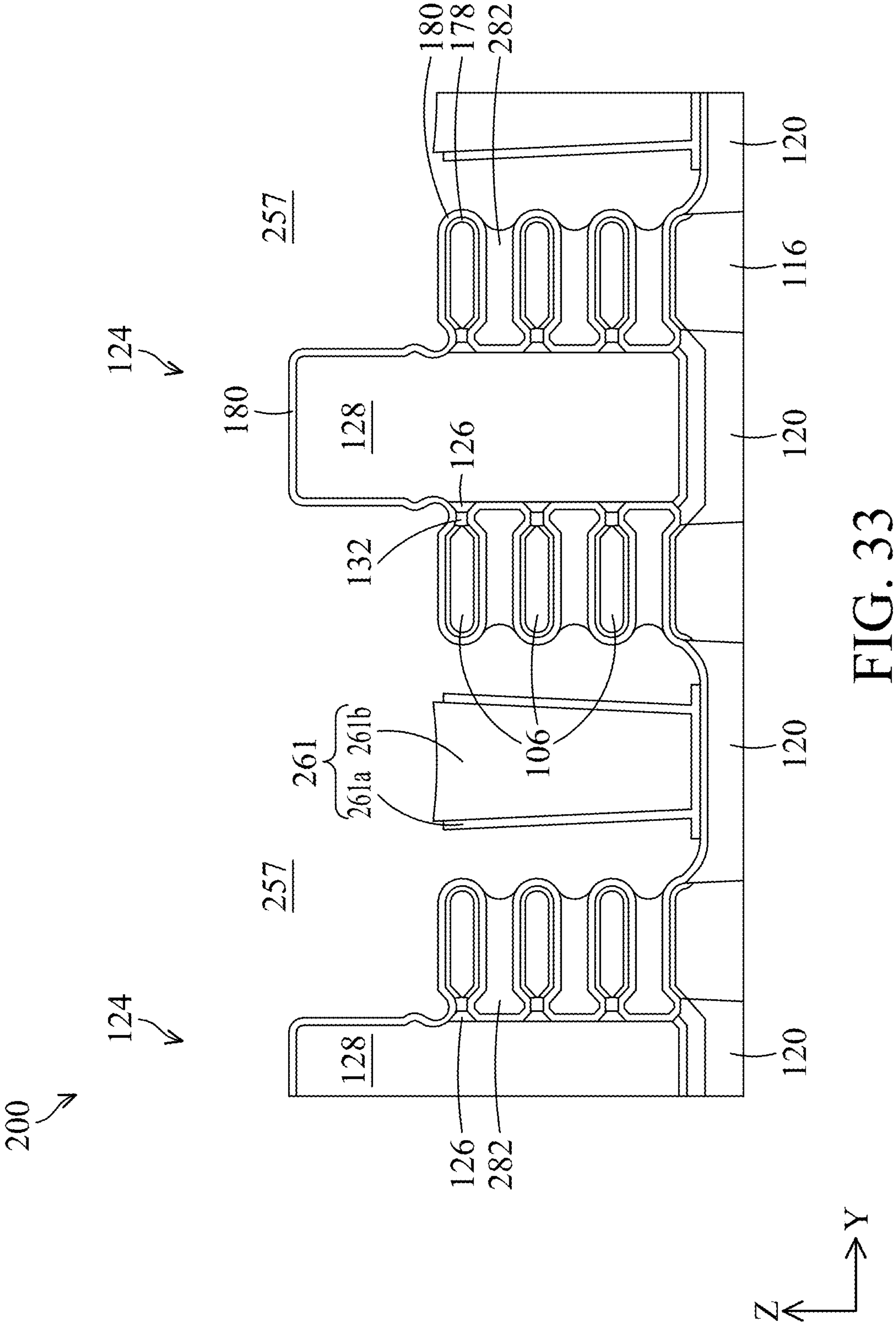

In FIG. 33, the protection structure 249 is removed. The protection structure 249 may be removed using one or more etch processes. The one or more etch processes may be a selective and/or time-controlled etch process that removes the protection structure 249 without substantially affecting the HK dielectric layer 180, the second dielectric wall 261, and the gate electrode layer 282. The removal of the protection structure 249 reveals the trenches 257.

Figure 34:
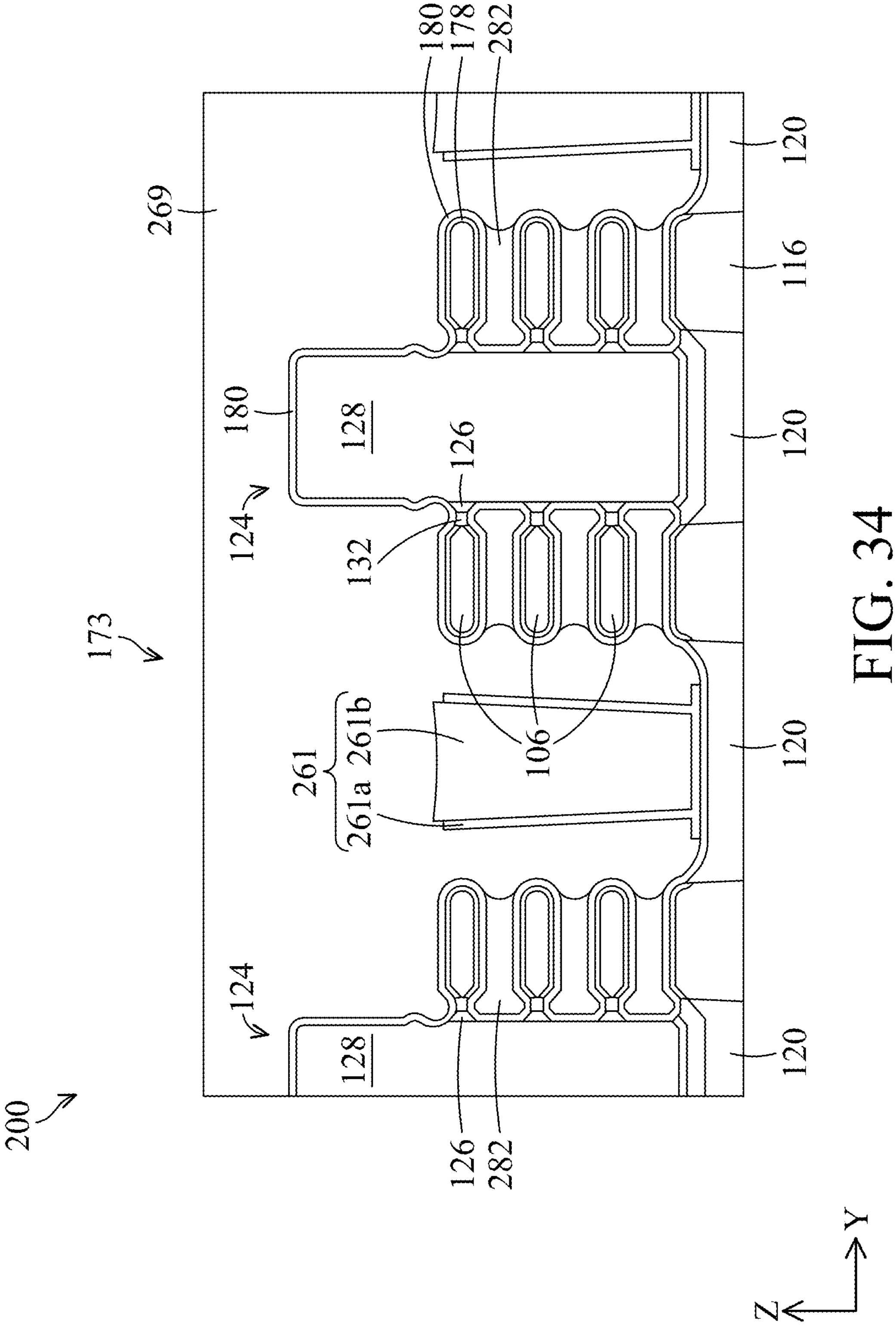

In FIG. 34, a metal layer 269, such as the metal layer 169, is formed to fill the trenches 257. The metal layer 269 serves as a gap-filling layer and becomes part of the gate electrode layer for the semiconductor device structure 200. Portions of the metal layer 269 are recessed, and the recessed metal layer 269 is combined with the gate electrode layer 282 to form a metal gate structure 273. The metal layer 269 and the gate electrode layer 282 may include the same or different material, and may be deposited in a similar fashion as the gate electrode layer 282. In some embodiments, the metal layer 269 and the gate electrode layer 282 include the same material. In some embodiments, the metal layer 269 and the gate electrode layer 282 include a material that is chemically different from each other.

Figure 35:
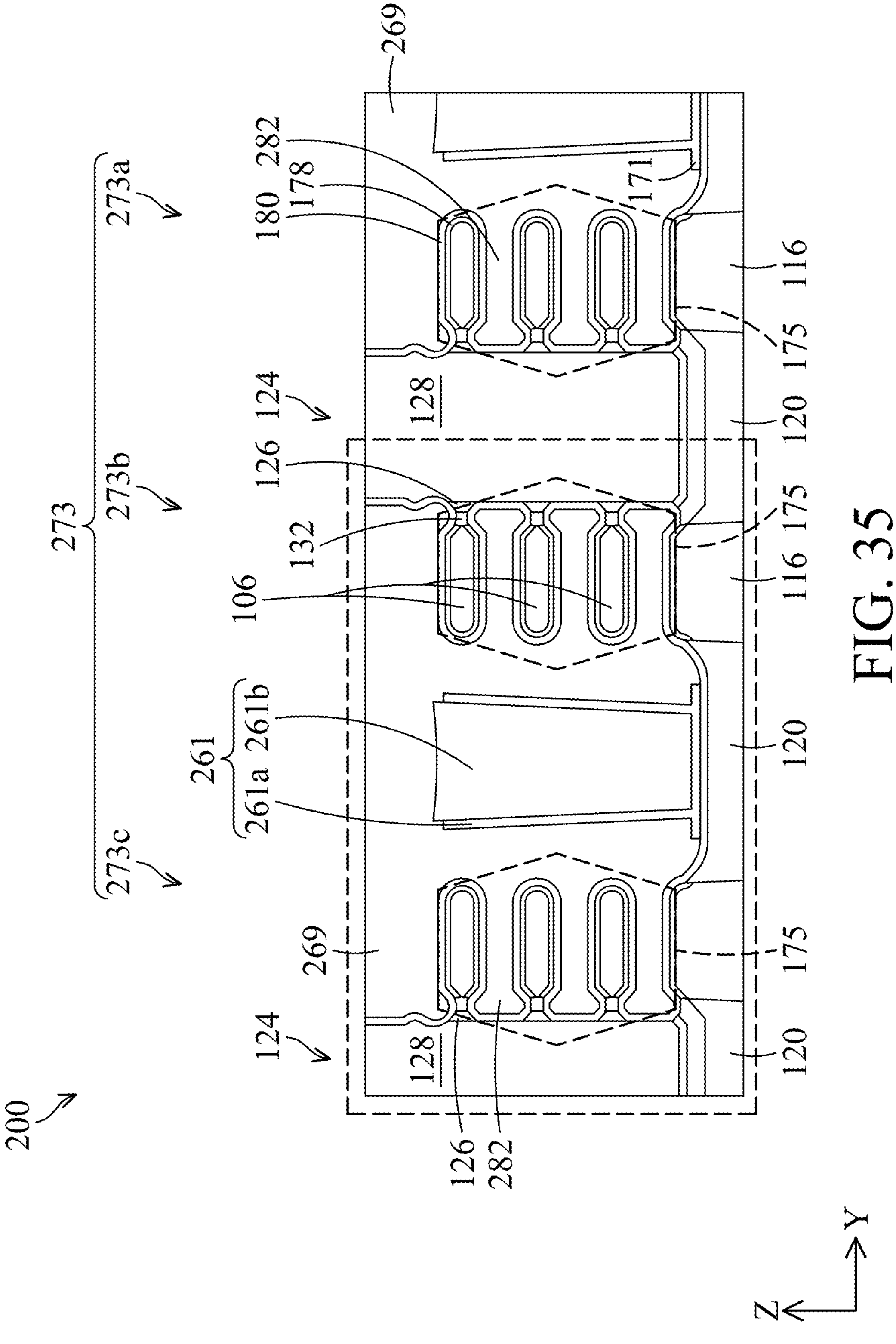

In FIG. 35, a planarization process is performed on the semiconductor device structure 200. The planarization process may be performed until the dielectric layer 128 of the first dielectric wall 124 is exposed. In some embodiments, the planarization process is performed to remove portions of the metal layer 269, the HK dielectric layer 280, and the dielectric layer 128 of the first dielectric wall 124. Upon completion of the planarization process, the top surfaces of the metal layer 269, the HK dielectric layer 180, and the dielectric layer 128 of the first dielectric wall 124 are substantially co-planar. In some embodiments, the metal gate structure 273 may include a first metal gate structure portion 273*a*, a second metal gate structure portion 273*b*, and a third metal gate structure portion 273*c*. The first metal gate structure portion 273*a* and the second metal gate structure portion 273*b* are separated from each other by the first dielectric wall 124. The second metal gate structure portion 273*b* and the third metal gate structure portion 273*c* are separated from each other by the second dielectric wall 261. Each of the metal gate structure portions 273*a*, 273*b*, 273*c* includes the plurality of first semiconductor layers 106 vertically stacked over the substrate 101 and separated from each other, the HK dielectric layer 180 covering each of the first semiconductor layers 106, and the IL 178 disposed between the HK dielectric layer 180 and the first semiconductor layer 106. While not shown, it is contemplated that various structural limitations/dimensions discussed above with respect to FIG. 27 are applicable to the embodiment shown in FIG. 35.

Likewise, the first dielectric wall 124 is disposed over the substrate 101 and is physically connected (through the liner 126 and the cap layer 132) to first semiconductor layers 106 disposed on opposing sides of the first dielectric wall 124. The second dielectric wall 261 is disposed over the substrate 101 and physically separates the second metal gate structure portion 273*b* and the third metal gate structure portion 273*c* from each other. The metal gate structure 273 disposed over the second dielectric wall 261 electrically connects the second metal gate structure portion 273*b* and the third metal gate structure portion 273*c*. Since the second dielectric wall 261 occupies portions of the metal gate structure 273, the effective capacitance Ceff) of the metal gate structure 273 is decreased. As a result, the gate-to-S/D (represented by dashed lines 175) parasitic capacitance (Cgd) is reduced.

Figure 36:
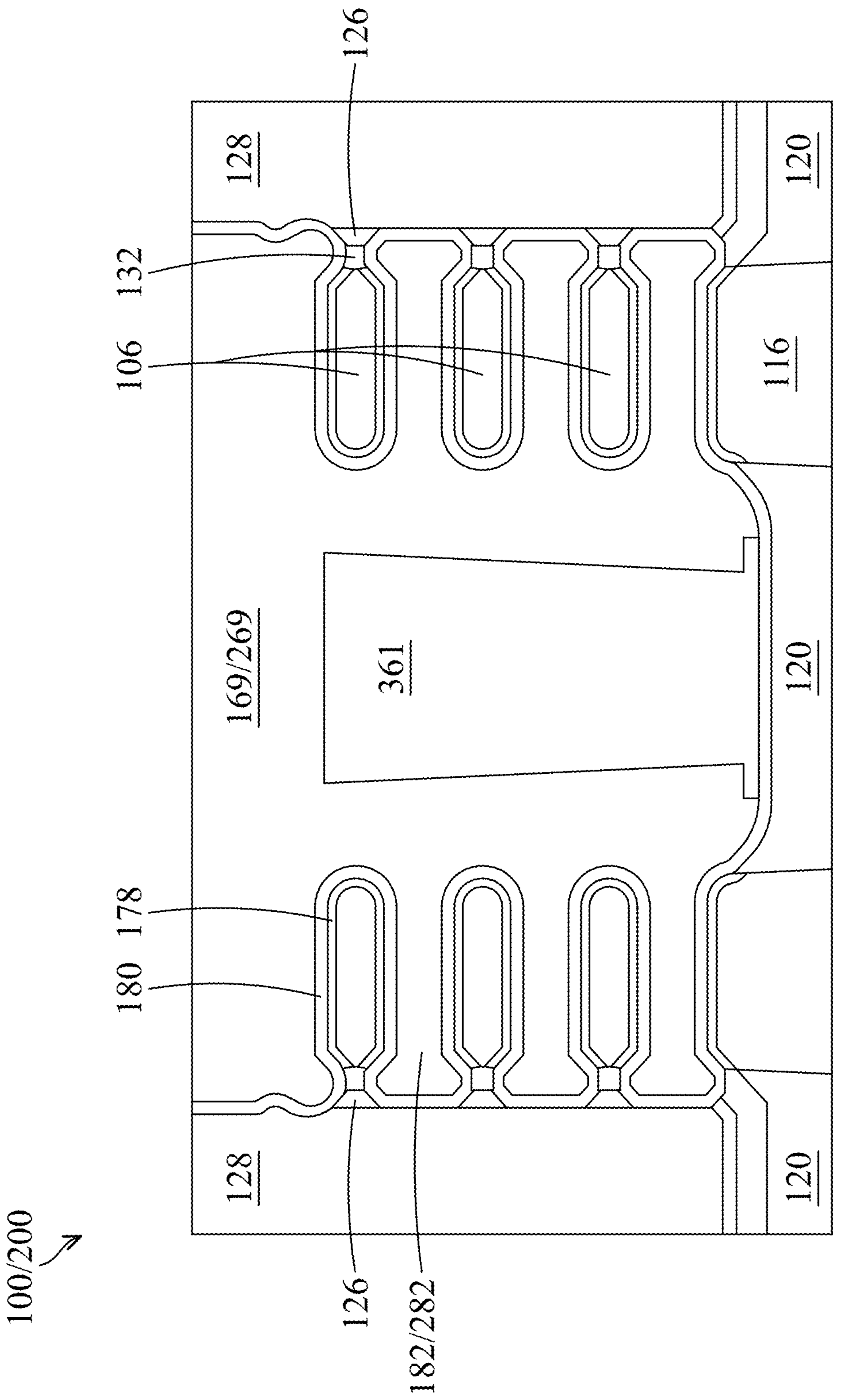
Figure 37:
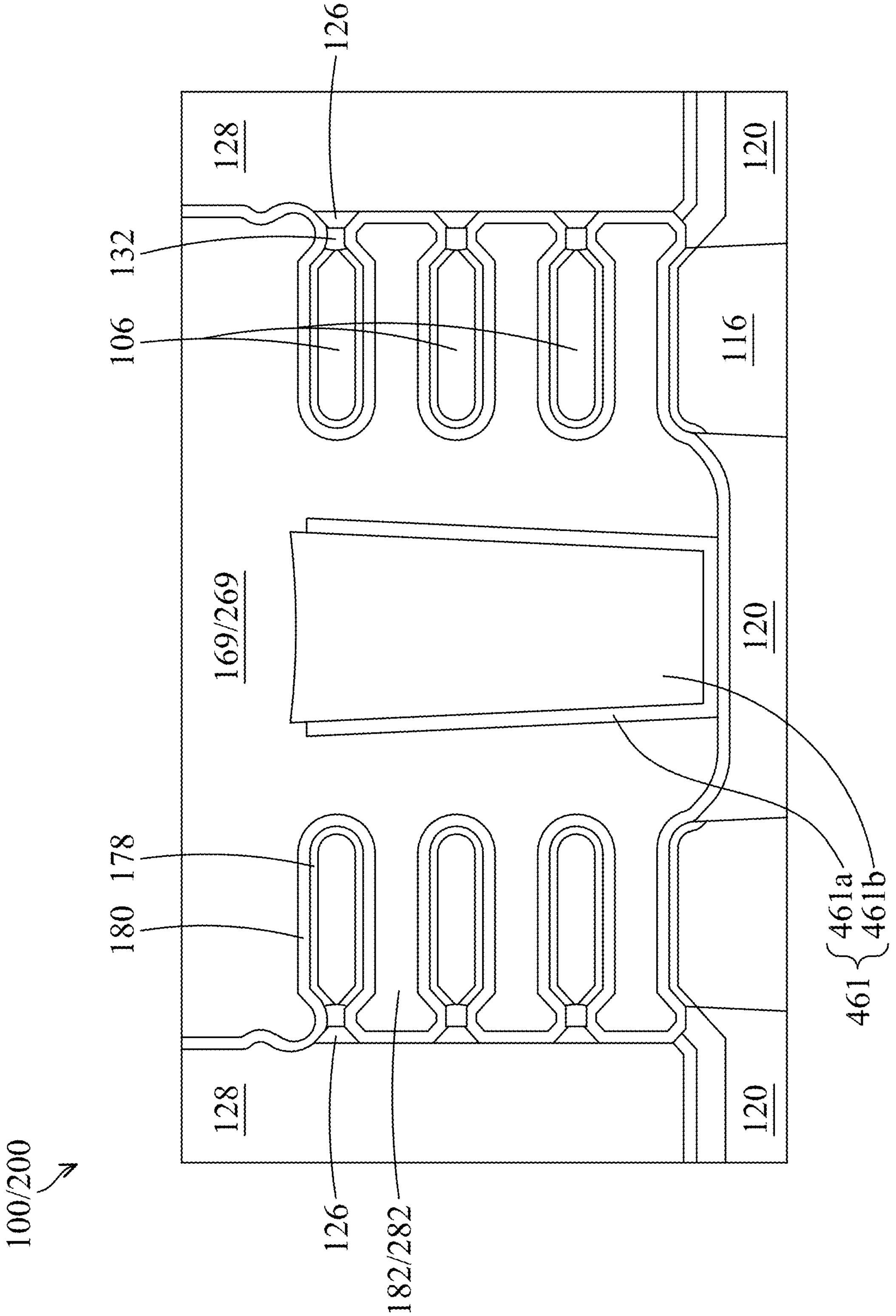
Figure 38:
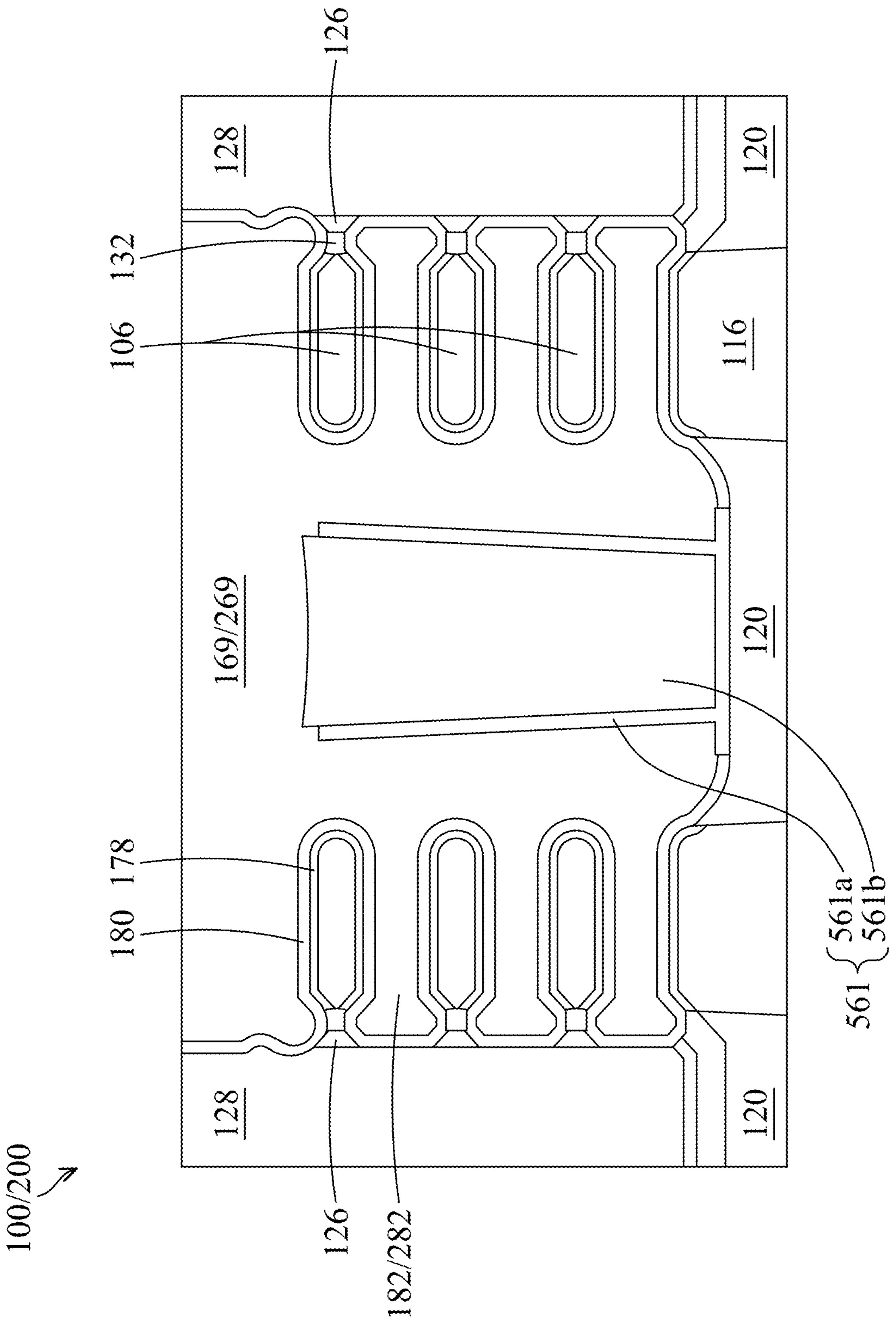

FIGS. 36-38 illustrate cross-sectional views of a portion of the semiconductor device structure 100/200, in accordance with some embodiments. The semiconductor device structure 100/200 in FIG. 36 is substantially identical to the embodiments shown in FIGS. 27 and 35 except that a second dielectric wall 361, such as the second dielectric wall 161, 261, is formed of a single material. That is, the first and second dielectric layers 161*a*/261*a* and 161*b*/261*b* are formed of the same material. The semiconductor device structure 100/200 in FIG. 37 is substantially identical to the embodiments shown in FIGS. 27 and 35 except that a second dielectric wall 461, such as the second dielectric wall 161, 261, has a first dielectric layer 461*a* and a second dielectric layer 461*b* formed on the first dielectric layer 461*a*, and the first dielectric layer 461*a* does not extend laterally into a region between the gate electrode layer 169/269 and the HK dielectric layer 180. The semiconductor device structure 100/200 in FIG. 38 is substantially identical to the embodiments shown in FIGS. 27 and 35 except that a second dielectric wall 561, such as the second dielectric wall 161, 261, has a first dielectric layer 561*a* and a second dielectric layer 561*b* formed on the first dielectric layer 561*a*, and the first dielectric layer 561*a* is in direct contact with a top surface of the isolation region 120.

It is understood that the semiconductor device structure 100/200 may undergo further complementary metal oxide semiconductor (CMOS) and/or back-end-of-line (BEOL) processes to form various features such as transistors, contacts/vias, interconnect metal layers, dielectric layers, passivation layers, etc. The semiconductor device structure 100/200 may also include backside contacts (not shown) on the backside of the substrate 101 so that either source or drain of the epitaxial S/D features is connected to a backside power rail (e.g., positive voltage VDD or negative voltage VSS) through the backside contacts.

Various embodiments of the present disclosure provide semiconductor device structures having a forksheet-like dielectric wall structure an embedded cut metal gate (CMG) isolation structure to minimize gate-to-source/drain parasitic capacitance. The forksheet-like dielectric wall structure and the dielectric wall structure may be formed as part of a metal gate isolation process. In forksheet-like dielectric wall structure separates metal gate structures prior to forming of metal gate structures. The CMG isolation structure is embedded in a gate electrode layer and therefore reduces the amount of the gate electrode layer between the neighboring transistors that would otherwise induce large gate-to-S/D parasitic capacitance. As a result, the gate-to-S/D parasitic capacitance of the semiconductor device structure is reduced.

An embodiment is a semiconductor device structure. The structure includes a dielectric wall disposed over a substrate, first and second metal gate structure portions respectively disposed at either side of the dielectric wall. Each first and second metal gate structure portion includes a plurality of semiconductor layers vertically stacked and separated from each other, a high-K (HK) dielectric layer disposed to surround at least three surfaces of each of the semiconductor layers, and a gate electrode layer disposed between two neighboring semiconductor layers. The semiconductor device structure also includes a metal layer disposed over the top surface and two opposing sidewalls of the dielectric wall.

Another embodiment is a semiconductor device structure. The structure includes a first dielectric wall disposed over a substrate, a first transistor comprising a first plurality of semiconductor layers vertically stacked over the substrate and disposed at a first side of the first dielectric wall, wherein a first side of each of the first plurality of semiconductor layers is connected to the first dielectric wall. The structure also includes a first gate electrode layer disposed between two neighboring semiconductor layers of the first plurality of semiconductor layers, and a second dielectric wall disposed adjacent to and separated from a second side of each of the first plurality of semiconductor layers by the first gate electrode layer.

A further embodiment is a method for forming a semiconductor device structure. The method includes forming a first fin structure, a second fin structure, and a third fin structure from a substrate, wherein the second fin structure is disposed between the first and third fin structures, and each first, second, and third fin structure comprises a plurality of first semiconductor layers and a plurality of second semiconductor layers alternatingly stacked. The method also includes forming a first fin structure, a second fin structure, and a third fin structure from a substrate, wherein the second fin structure is disposed between the first and third fin structures, and each first, second, and third fin structure comprises a plurality of first semiconductor layers and a plurality of second semiconductor layers alternatingly stacked. The method includes forming a first dielectric wall between the second and third fin structures, and removing the second semiconductor layers from the first, second, and third fin structures so that the first semiconductor layers of at least first and second fin structures extend outwardly from a first and a second side of the first dielectric wall, respectively. The method includes filling a space between two neighboring first semiconductor layers of the first, second, and third fin structures with a gate electrode layer, forming a second dielectric wall between the first and second fin structures, recessing the second dielectric wall so that a top surface of the second dielectric wall is at an elevation below a top surface of the first dielectric wall. The method further includes forming a metal layer to cover the first and second dielectric walls as well as the first semiconductor layers of the first, second, and third fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a dielectric wall disposed over a substrate;
first and second metal gate structure portions respectively disposed at either side of the dielectric wall, wherein each first and second metal gate structure portion comprises:
a plurality of semiconductor layers vertically stacked and separated from each other;
a high-K (HK) dielectric layer disposed to surround at least three surfaces of each of the semiconductor layers; and
a gate electrode layer disposed between two neighboring semiconductor layers; and
a metal layer disposed on two opposing sidewalls of the dielectric wall.

2. The semiconductor device structure of claim 1, wherein a top surface of the dielectric wall and a top surface of a topmost semiconductor layer of at least first or second metal gate structure portion are at substantially the same elevation.

3. The semiconductor device structure of claim 1, wherein a top surface of the dielectric wall is at an elevation higher than a top surface of a topmost semiconductor layer of at least first or second metal gate structure portion.

4. The semiconductor device structure of claim 1, wherein a first distance between an end of a topmost semiconductor layer of the first metal gate structure portion to a first side of the dielectric wall is different than a second distance between an end of a topmost semiconductor layer of the second metal gate structure portion to a second side of the dielectric wall.

5. The semiconductor device structure of claim 4, wherein the first distance is different than a third distance between an end of a bottommost semiconductor layer of the first metal gate structure portion to the first side of the dielectric wall.

6. The semiconductor device structure of claim 1, wherein the dielectric wall comprises a first dielectric layer and a second dielectric layer, and the second dielectric layer has a sidewall in contact with the first dielectric layer.

7. The semiconductor device structure of claim 6, wherein a portion of the first dielectric layer extends laterally into the metal layer.

8. The semiconductor device structure of claim 6, wherein the metal layer is disposed between and in contact with the gate electrode layer and the first dielectric layer.

9. The semiconductor device structure of claim 8, wherein the metal layer and the gate electrode layer are formed of the same material.

10. The semiconductor device structure of claim 8, wherein the metal layer and the gate electrode layer comprise a material that is chemically different from each other.

11. A semiconductor device structure, comprising:
a first dielectric wall disposed over a substrate;
a first transistor comprising a first plurality of semiconductor layers vertically stacked over the substrate and disposed at a first side of the first dielectric wall, wherein a first side of each of the first plurality of semiconductor layers is connected to the first dielectric wall;
a first gate electrode layer disposed between two neighboring semiconductor layers of the first plurality of semiconductor layers, wherein a top surface of the first gate electrode layer is substantially co-planar with a top surface of the first dielectric wall; and
a second dielectric wall disposed adjacent to and separated from a second side of each of the first plurality of semiconductor layers.

12. The semiconductor device structure of claim 11, further comprising:
a liner;
a cap layer surrounding the plurality of semiconductor layers and in contact with the liner, wherein each of the first plurality of semiconductor layers is connected to the first dielectric wall through the cap layer and the liner; and
a high-K dielectric in contact with the first dielectric wall, the liner, and the cap layer.

13. The semiconductor device structure of claim 11, wherein the top surface of the first dielectric wall and a top surface of the second dielectric wall are substantially co-planar.

14. The semiconductor device structure of claim 13, wherein the top surface of the second dielectric wall is at an elevation higher than a top surface of the topmost semiconductor layer of the first plurality of semiconductor layers.

15. The semiconductor device structure of claim 11, wherein the top surface of the first dielectric wall is at an elevation higher than a top surface of the second dielectric wall.

16. The semiconductor device structure of claim 15, wherein the first gate electrode layer is in further contact with the top surface of the second dielectric wall.

17. The semiconductor device structure of claim 16, wherein the top surface of the second dielectric wall is at an elevation that is substantially level with a top surface of the topmost semiconductor layer of the first plurality of semiconductor layers.

18. A method for forming a semiconductor device structure, comprising:

forming a first fin structure, a second fin structure, and a third fin structure from a substrate, wherein the second fin structure is disposed between the first and third fin structures, and each first, second, and third fin structure comprises a plurality of first semiconductor layers and a plurality of second semiconductor layers alternatingly stacked;

forming a first dielectric wall between the second and third fin structures;

removing the second semiconductor layers from the first, second, and third fin structures so that the first semiconductor layers of at least first and second fin structures extend outwardly from a first and a second side of the first dielectric wall, respectively;

filling a space between two neighboring first semiconductor layers of the first, second, and third fin structures with a gate electrode layer;

forming a second dielectric wall between the first and second fin structures;

recessing the second dielectric wall so that a top surface of the second dielectric wall is at an elevation below a top surface of the first dielectric wall; and forming a metal layer to cover the first and second dielectric walls as well as the first semiconductor layers of the first, second, and third fin structures.

19. The method of claim 18, further comprising:

performing a planarization process so that a top surface of the first dielectric wall and a top surface of the metal layer are substantially co-planar.

20. The method of claim 18, further comprising:

performing a planarization process so that top surfaces of the first dielectric wall, the second dielectric wall, and topmost first semiconductor layers of the first, second, and third fin structures are substantially co-planar.

* * * * *